US007307529B2

(12) United States Patent
Gutnik et al.

(10) Patent No.: US 7,307,529 B2
(45) Date of Patent: Dec. 11, 2007

(54) RFID TAGS WITH ELECTRONIC FUSES FOR STORING COMPONENT CONFIGURATION DATA

(75) Inventors: Vadim Gutnik, Irvine, CA (US); John D. Hyde, Corvallis, OR (US); David D. Dressler, Shoreline, WA (US); Alberto Pesavento, Seattle, WA (US); Ronald A. Oliver, Seattle, WA (US); Scott Anthony Cooper, Seattle, WA (US); Kurt Eugene Sundstrom, Woodinville, WA (US)

(73) Assignee: IMPINJ, Inc., Seattle, WA (US)

( * ) Notice: Subject to any disclaimer, the term of this patent is extended or adjusted under 35 U.S.C. 154(b) by 370 days.

(21) Appl. No.: 11/016,546

(22) Filed: Dec. 17, 2004

(65) Prior Publication Data

US 2006/0133175 A1 Jun. 22, 2006

(51) Int. Cl.
*G08B 13/14* (2006.01)

(52) U.S. Cl. ...................................... 340/572.1; 365/96

(58) Field of Classification Search ............... 34/572.1, 34/10; 235/492; 700/215; 365/96, 225.7
See application file for complete search history.

(56) References Cited

U.S. PATENT DOCUMENTS

| | | | | |
|---|---|---|---|---|
| 4,384,288 | A | 5/1983 | Walton | 340/825.34 |
| 4,388,524 | A | 6/1983 | Walton | 235/380 |
| 4,546,241 | A | 10/1985 | Walton | 235/380 |
| 4,580,041 | A | 4/1986 | Walton | 235/380 |
| 5,361,001 | A | 11/1994 | Stolfa | 327/530 |
| 5,384,727 | A | 1/1995 | Moyal et al. | 365/96 |
| 5,412,594 | A | 5/1995 | Moyal et al. | 365/96 |
| 6,011,425 | A | 1/2000 | Oh et al. | 327/525 |
| 6,151,238 | A * | 11/2000 | Smit et al. | 365/96 |
| 6,236,223 | B1 * | 5/2001 | Brady et al. | 324/765 |
| 6,538,468 | B1 * | 3/2003 | Moore | 326/40 |
| 6,641,050 | B2 * | 11/2003 | Kelley et al. | 235/492 |
| 6,903,436 | B1 * | 6/2005 | Luo et al. | 257/529 |
| 2001/0035816 | A1 * | 11/2001 | Beigel et al. | 340/10.42 |
| 2003/0218925 | A1 * | 11/2003 | Torjussen et al. | 365/200 |
| 2004/0017295 | A1 * | 1/2004 | Dishongh et al. | 340/572.1 |
| 2004/0021170 | A1 * | 2/2004 | Caywood | 257/315 |
| 2004/0037127 | A1 * | 2/2004 | Lindhorst et al. | 365/202 |
| 2004/0080982 | A1 * | 4/2004 | Roizin | 365/185.28 |
| 2004/0263319 | A1 * | 12/2004 | Huomo | 340/10.2 |
| 2005/0219931 | A1 * | 10/2005 | Diorio et al. | 365/225.7 |

OTHER PUBLICATIONS

U.S. Official Action dated Apr. 4, 2007 cited in U.S. Appl. No. 11/015,293.

* cited by examiner

*Primary Examiner*—Jeffery Hofsass
*Assistant Examiner*—Hongmin Fan
(74) *Attorney, Agent, or Firm*—Merchant & Gould; Carl K. Turk; Gregory T. Kavounas

(57) ABSTRACT

An RFID tag has a fuse that is adapted to store configuration data in a way that survives loss of power. The fuse can be one time programmable or many times programmable, and be implemented with a non-volatile memory. The configuration data becomes available to an operational component of the tag, such as at power up, controlling its performance.

62 Claims, 19 Drawing Sheets

RFID TAGS WITH ELECTRONIC FUSES FOR STORING COMPONENT CONFIGURATION DATA

RELATIONSHIP TO OTHER PATENT APPLICATIONS

This application may be found to be related to another application by inventors Vadim Gutnik, John Hyde, David D. Dressler, Alberto Pesavento, Ronald A. Oliver, Scott Cooper and Kurt Sundstrom, titled "RFID TAGS STORING COMPONENT CONFIGURATION DATA IN NON-VOLATILE MEMORY AND METHODS", filed with the USPTO on the same day as the present application, and due to be assigned to the same assignee.

This application incorporates by reference US patent application titled "REWRITEABLE ELECTRONIC FUSES", filed with the USPTO on 2004 Mar. 30, and having Ser. No. 10/813,907

This application incorporates by reference US patent application titled "REWRITEABLE ELECTRONIC FUSES", filed with the USPTO on 2004 Mar. 30, and having Ser. No. 10/814,866

This application incorporates by reference US patent application titled "REWRITEABLE ELECTRONIC FUSES", filed with the USPTO on 2004 Mar. 30, and having Ser. No. 10/814,868

1. Field of the Invention

The present invention is related to the field of Radio Frequency IDentification (RFID) systems, and more specifically to RFID tags with a component whose operation depends on configuration data stored in an on-board memory, and methods.

2. Background.

Radio Frequency IDentification (RFID) systems typically include RFID tags and RFID readers, which are also known as RFID reader/writers. RFID systems can be used in many ways for locating and identifying objects to which they are attached. RFID systems are particularly useful in product-related and service-related industries for tracking large numbers of objects being processed, inventoried, or handled. In such cases, an RFID tag is usually attached to an individual item, or to its package.

In principle, RFID techniques entail using an RFID reader to interrogate one or more RFID tags. Interrogation is performed by the reader transmitting a Radio Frequency (RF) wave. A tag that senses the interrogating RF wave responds by transmitting back another RF wave. The tag generates the transmitted back RF wave either originally, or by reflecting back a portion of the interrogating RF wave, a process known as backscatter. Backscatter may take place in a number of ways.

The reflected back RF wave may further encode data stored internally in the tag, such as a number. The response, and the data if available, is decoded by the reader, which thereby identifies, counts, or otherwise interacts with the associated item. The data can denote a serial number, a price, a date, a destination, other attribute(s), any combination of attributes, and so on.

An RFID tag typically includes an antenna system, a power management section, a radio section, and frequently a logical section, a memory, or both. In earlier RFID tags, the power management section included a power storage device, such as a battery. RFID tags with a power storage device are known as active tags. Advances in semiconductor technology have miniaturized the electronics so much that an RFID tag can be powered by the RF signal it receives enough to be operated. Such RFID tags do not include a power storage device, and are called passive tags.

BRIEF SUMMARY

The invention improves over the prior art.

Briefly, an RFID tag has a fuse that is adapted to store configuration data in a way that survives loss of power. The configuration data becomes available to an operational component of the tag. A performance of the operational component is thus adjusted according to the configuration data, and the configuration data is maintained even if power is lost.

These and other features and advantages will be better understood from the specification, which includes the following Detailed Description and accompanying Drawings.

BRIEF DESCRIPTION OF THE DRAWINGS

The following Detailed Description proceeds with reference to the accompanying Drawings, in which.

DETAILED DESCRIPTION

Figure 1:
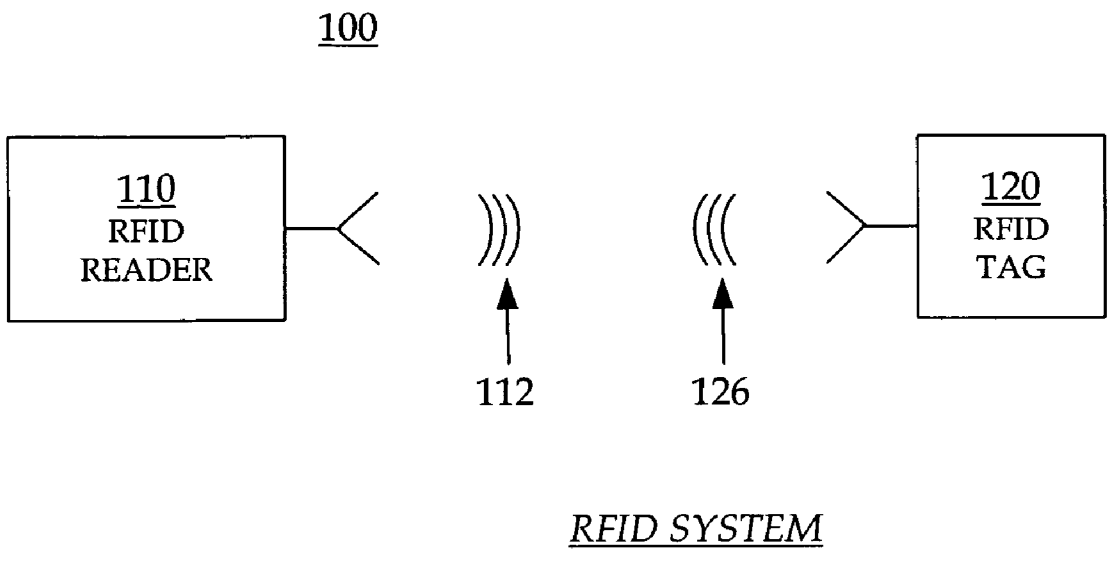
FIG. 1 is a block diagram of an RFID system.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. This description is, therefore, not to be taken in a limiting sense.

The present description is related RFID tags with one or more components whose performance depends on configuration data stored in an on-board fuse, and methods. The invention is now described in more detail.

FIG. 1 is a diagram of an RFID system 100 according to the invention. An RFID reader 110 made according to the invention transmits an interrogating Radio Frequency (RF) wave 112. An RFID tag 120 made according to the invention in the vicinity of RFID reader 110 may sense interrogating RF wave 112, and generate backscatter wave 126 in response. RFID reader 110 senses and interprets backscatter wave 126.

Reader 110 and tag 120 exchange data via wave 112 and wave 126. In a session of such an exchange, each encodes and transmits data to the other, and each receives and decodes data from the other. The data is encoded into, and decoded from, RF waveforms, as will be seen in more detail below.

Encoding the data can be performed in a number of different ways. For example, protocols are devised to communicate in terms of symbols, also called RFID symbols. A symbol for communicating can be a preamble, a null symbol and so on. Further symbols can be implemented for exchanging binary data, such as “0” and “1”.

Figure 2:
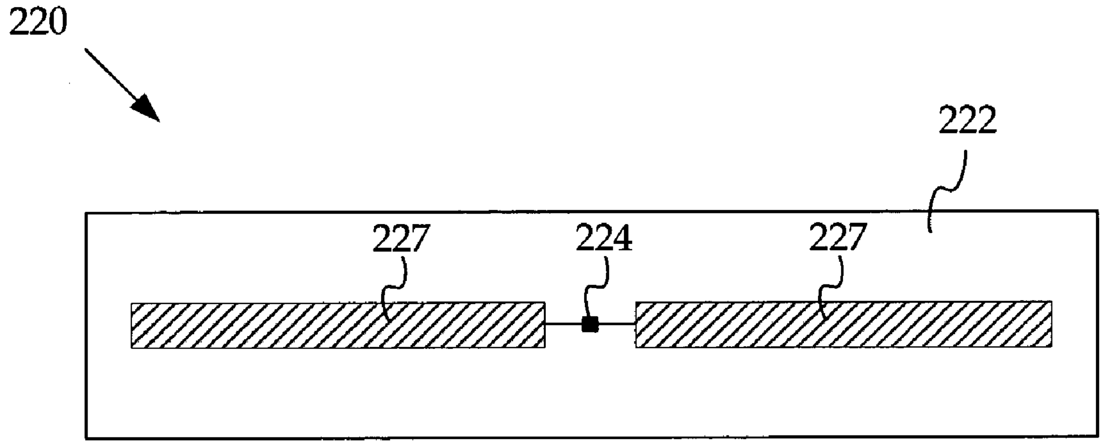
FIG. 2 is a diagram showing components of a passive RFID tag, such as the tag shown in FIG. 1.

FIG. 2 is a diagram of a passive RFID tag 220. Tag 220 is formed on a substantially planar inlay 222, which can be made in many ways known in the art. Tag 220 also includes two antenna segments 227, which are usually flat and attached to inlay 222. Antenna segments 227 are shown here forming a dipole, but many other embodiments are possible.

Tag 220 also includes an electrical circuit, which is preferably implemented in an integrated circuit (IC) chip 224. IC chip 224 is also arranged on inlay 222, and electrically coupled to antenna segments 227. Only one method of coupling is shown, while many are possible.

In operation, a wireless signal is received by antenna segments 227, and communicated to IC chip 224. IC chip 224 both harvests power, and decides how to reply, if at all. If it is decided to reply, IC chip 224 modulates the impedance of antenna segments 227, which generates the backscatter from a wave transmitted by the reader. The impedance can be modulated by repeatedly coupling together and uncoupling antenna segments 227.

Figure 3:
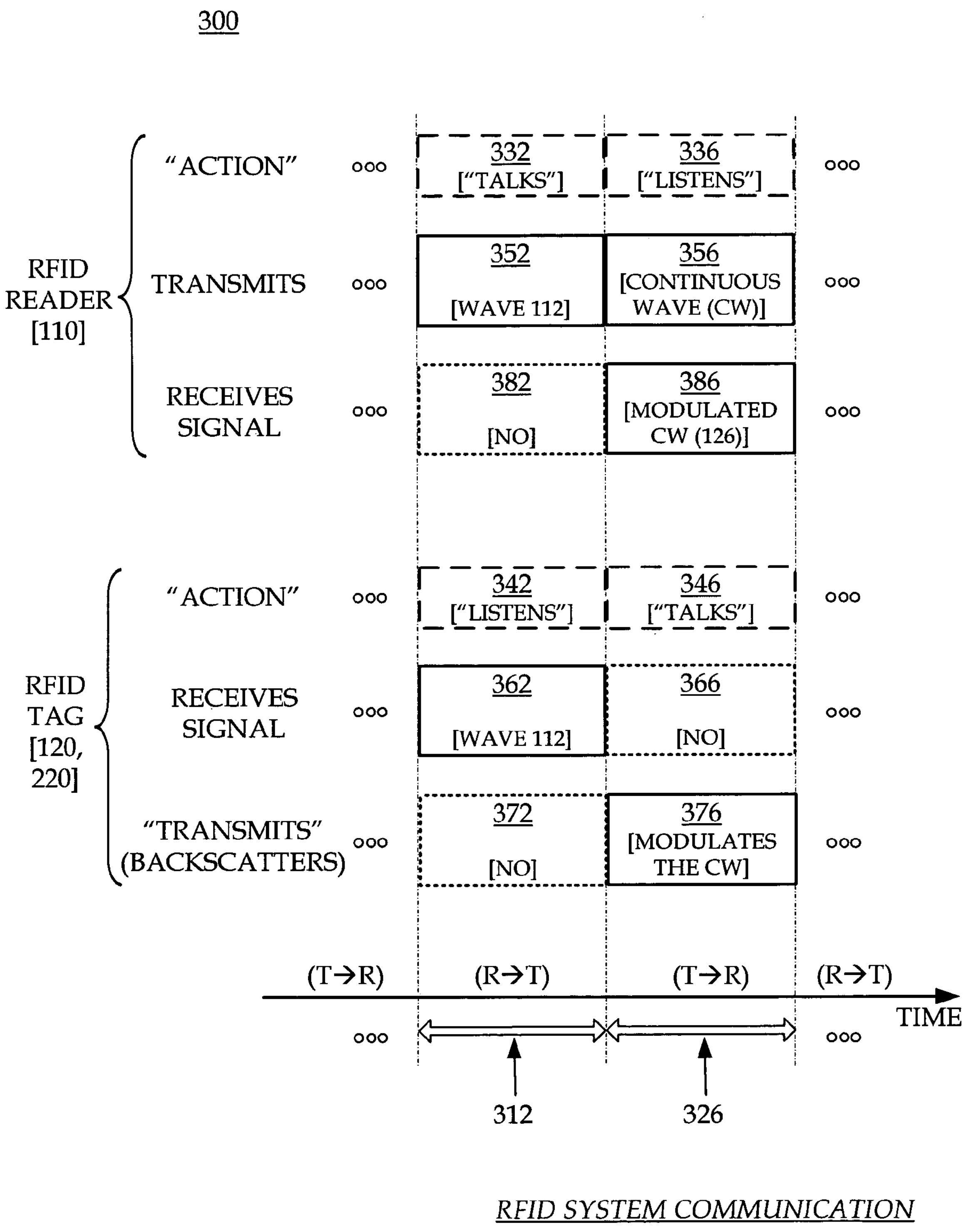
FIG. 3 is a conceptual diagram for explaining a frequent mode of communication between the components of the RFID system of FIG. 1 during normal operation in the field.

FIG. 3 is a conceptual diagram 300 for explaining the mode of communication between the components of the RFID system of FIG. 1, especially when tag 120 is implemented as passive tag 220 of FIG. 2. The explanation is made with reference to a TIME axis, and also to a human metaphor of “talking” and “listening”. The actual technical implementations for “talking” and “listening” are now described.

RFID reader 110 and RFID tag 120 talk and listen to each other by taking turns. As seen on axis TIME, when reader 110 talks to tag 120 the session is designated as “R→T”, and when tag 120 talks to reader 110 the session is designated as “T→R”. Along the TIME axis, a sample R→T session occurs during a time interval 312, and a following sample T→R session occurs during a time interval 326. Of course intervals 312, 326 can be of different durations—here the durations are shown about equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual technical behavior, during interval 312, reader 110 talks to tag 120 as follows. According to block 352, reader 110 transmits wave 112, which was first described in FIG. 1. At the same time, according to block 362, tag 120 receives wave 112 and processes it. Meanwhile, according to block 372, tag 120 does not backscatter with its antenna, and according to block 382, reader 110 has no wave to receive from tag 120.

During interval 326, tag 120 talks to reader 110 as follows. According to block 356, reader 110 transmits towards the tag a Continuous Wave (CW), which can be thought of as a carrier signal that ideally encodes no information. As discussed before, this carrier signal serves both to be harvested by tag 120 for its own internal power needs, and also to generate a wave that tag 120 can backscatter. Indeed, at the same time, according to block 366, tag 120 does not receive a signal for processing. Instead, according to block 376, tag 120 modulates the CW emitted according to block 356, so as to generate backscatter wave 126. Concurrently, according to block 386, reader 110 receives backscatter wave 126 and processes it.

Figure 4A:
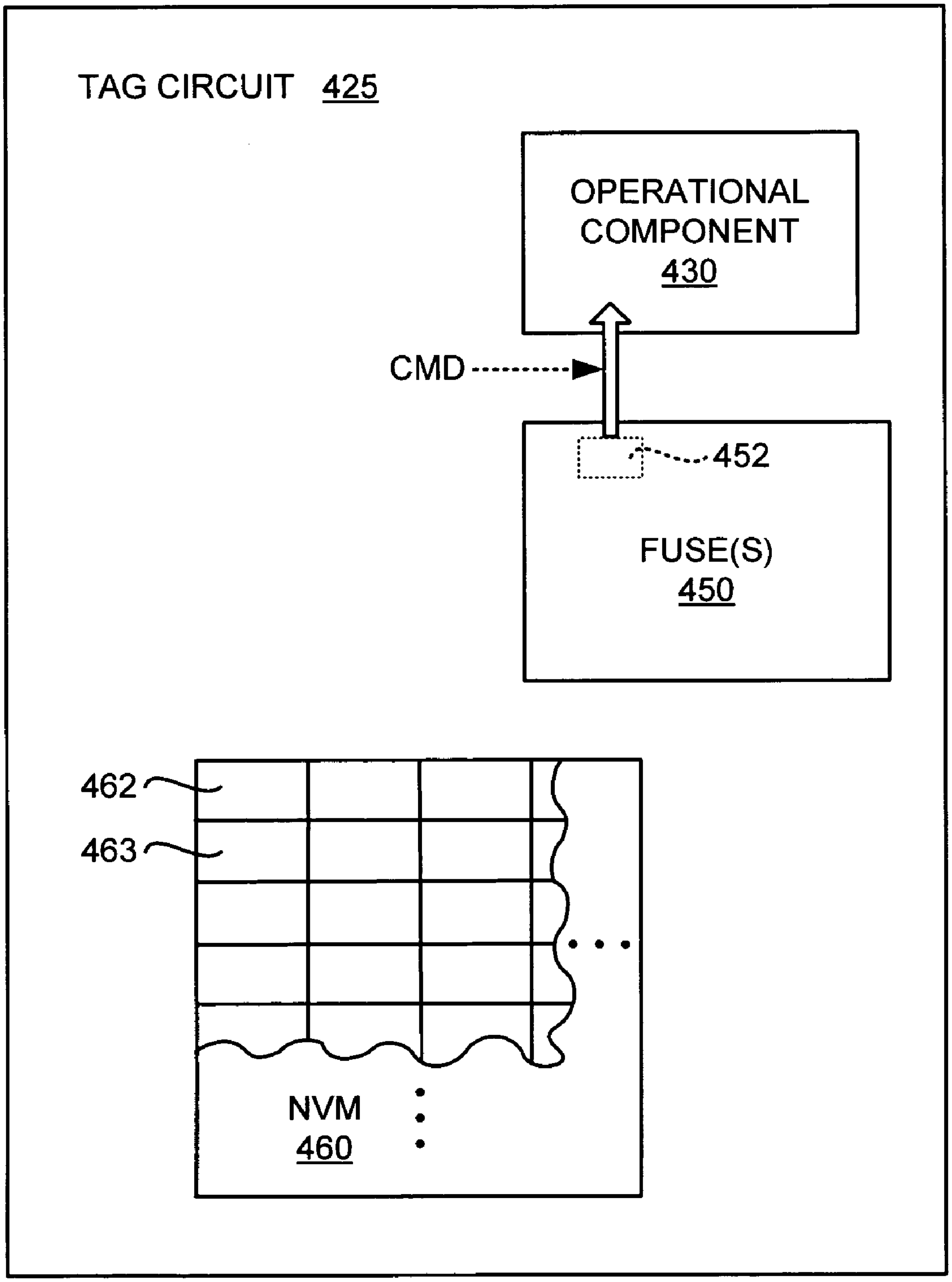
FIG. 4A is a block diagram of salient components of an RFID tag circuit according to embodiments of the invention, and further showing an embodiment where stored configuration data is input in an operational component responsive to a command.

FIG. 4A is a block diagram of salient components of an RFID tag circuit according to embodiments of the invention. A tag circuit 425 includes a non-volatile memory (NVM) memory array 460, which has NVM cells 462, 463, . . . . Cells 462, 463, . . . are addressable in terms of a row and a column, typically in a rectangular arrangement. Cells 462, 463, . . . store data, and maintain it even when tag circuit 425 loses power.

Tag circuit 425 also includes an operational component 430. As will be seen later in this description, operational component 430 is intended to be any one or more of a large possible number of components of circuit 425, including (NVM) memory array 460 itself, or even a controller that is described later.

Operational component 430 operates based on configuration data. A number of ways for accomplishing this are described later in this document. A distinction should be kept in mind, however, that the configuration data based on which operational component 430 operates is different from data that might be stored in the tag regarding its use, such as a serial number.

Tag circuit 425 additionally includes a fuse 450, which may be implemented in any number of ways. In some embodiments, fuse 450 is one-time programmable ("OTP"). In other embodiments, fuse 450 is multiple-times programmable ("MTP") or rewriteable, which means that updated data may be stored in it.

Fuse 450 is adapted to store data in a way that survives loss of power, such as a non-volatile way. In some embodiments, fuse 450 stores configuration data 452, which is the configuration data for operational component 430. Configuration data 452 encodes at least one value, or a series of values, for one or more operational components such as operational component 430. In some embodiments, a value for configuration data 452 is encoded in an amount of charge stored in a device. In another embodiment, configuration data 452 is at least one logical bit, such as a 1 or a zero.

Implementation preferably depends on the intended use. If fuse 450 is intended as OTP, configuration data 452 is predetermined. Fuse 450 can then be implemented by any way known in the art, such as a metal or polysilicon, which can be selectively blown by a laser, selective heating, an overcurrent, and so on. In addition, it can be implemented in other ways described in this document.

If fuse 450 is intended as MTP, configuration data 452 is determined during testing, such as after manufacturing, or even during use. Fuse 450 can then be implemented in many ways, including but not limited to memory elements, charge storage devices. In addition, it can be implemented in other ways described in this document.

Fuse 450 may be embodied as a standalone component. Alternately, fuse 450 may be part of operational component 430. Or, fuse 450 may be part of another operational component, such as a processor, for example the processor described below.

NVM memory array 460 is distinct from fuse 450. Indeed, array 460 has circuits for generating addresses in terms of rows and columns, while fuse 450 can output configuration data 452 more readily. This is a useful aspect, especially for use at power up.

Configuration data 452 may be input in operational component 430 via any number of paths. Two examples are described below.

Figure 4B:
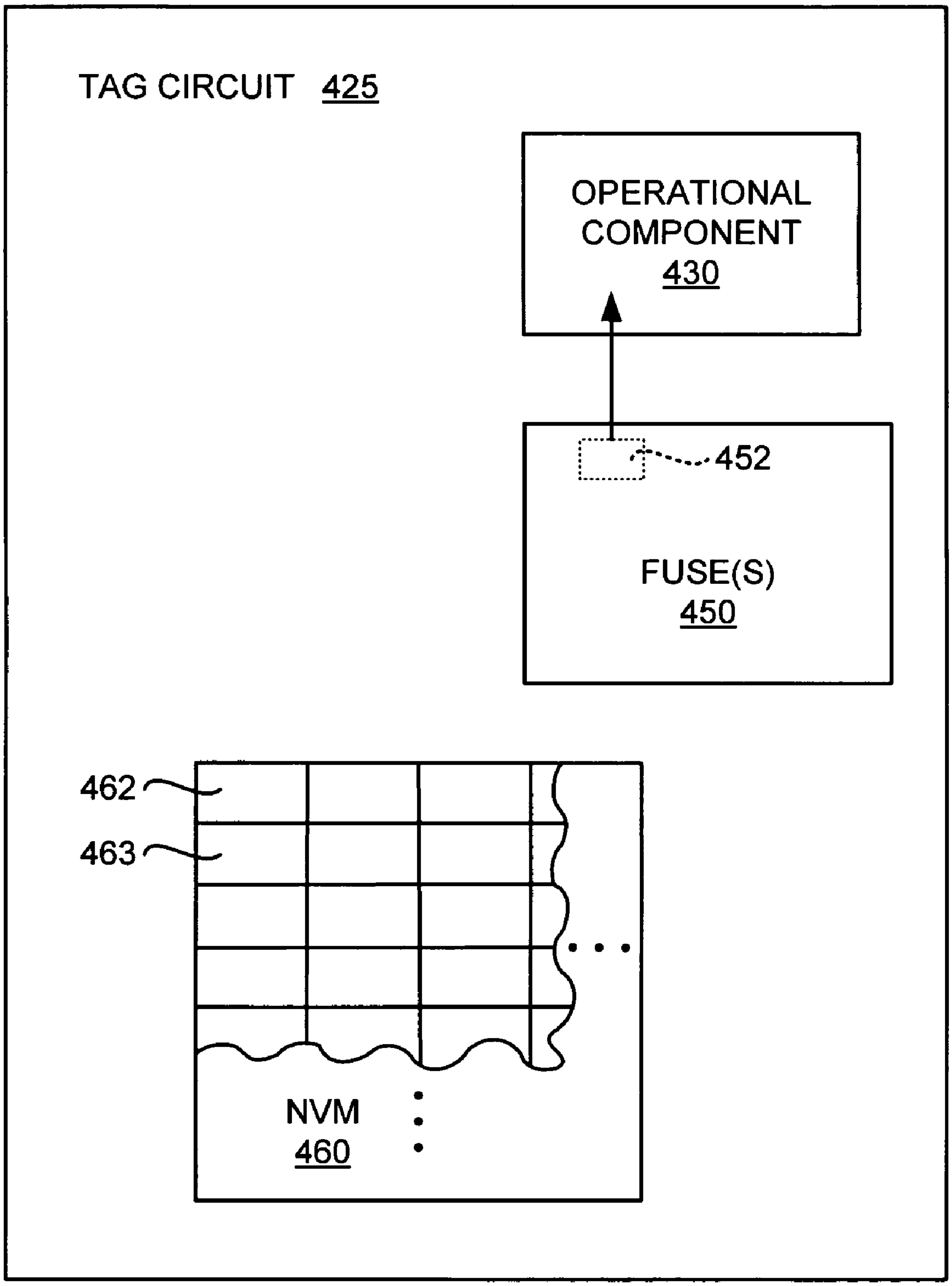
FIG. 4B is the block diagram of FIG. 4A, and further showing an embodiment where stored configuration data is input in an operational component directly.

FIG. 4B shows again tag circuit 425 of FIG. 4A. In the embodiment of FIG. 4B, configuration data 452 is input in operational component 430 directly from fuse 450. For example, this is the preferred embodiment for where the operational component is an antenna, to the extent it is receiving a first signal after it is in a power off state.

Figure 4C:
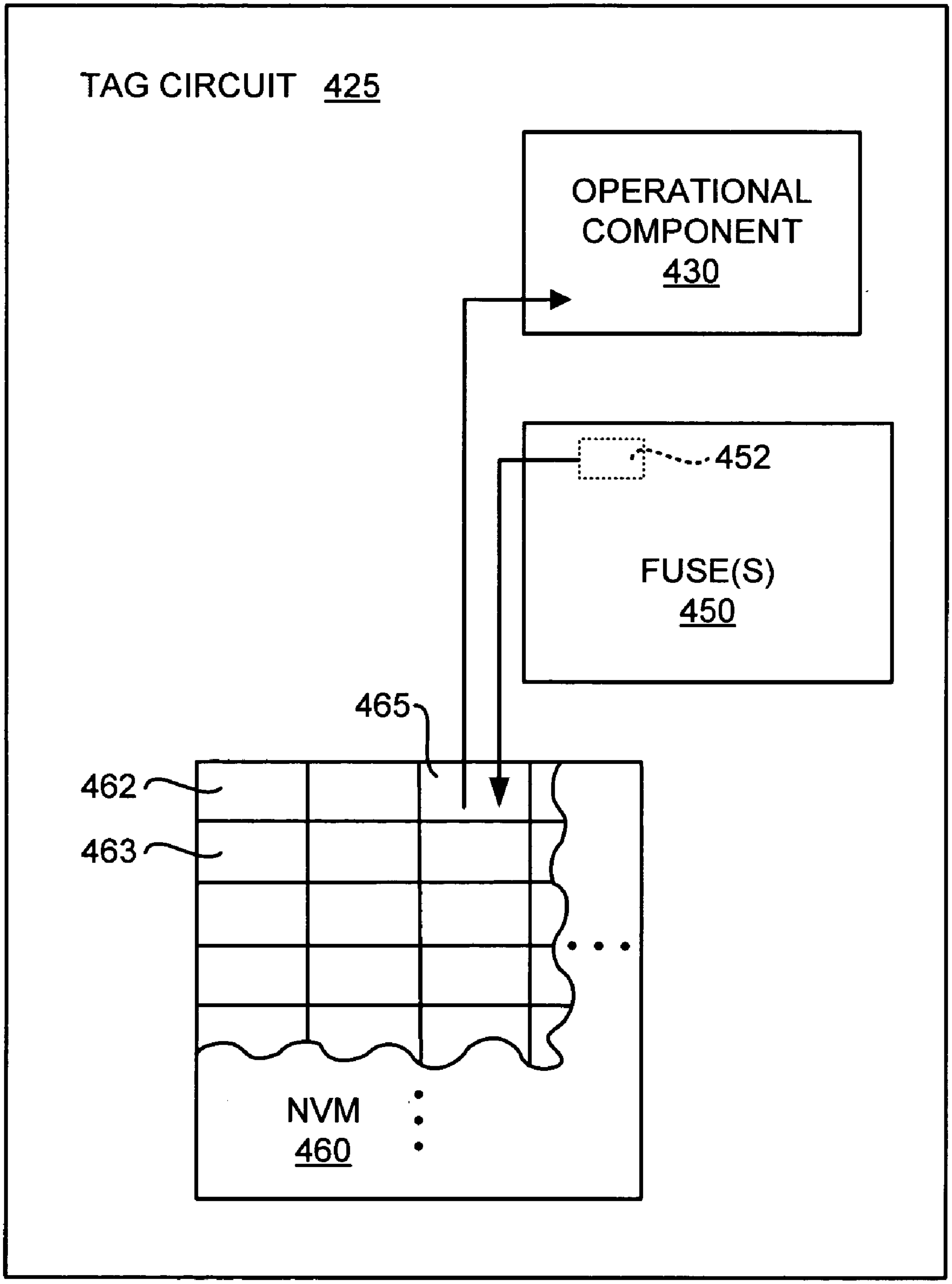
FIG. 4C is the block diagram of FIG. 4A, and further showing another embodiment where stored configuration data is input in an operational component indirectly.

FIG. 4C shows again tag circuit 425 of FIG. 4A. In the embodiment of FIG. 4C, configuration data 452 is input in operational component 430 indirectly. Before being input in operational component 430, configuration data 452 may be routed through any suitable component. In the particular example of FIG. 4C, configuration data 452 is first input in the NVM memory array 460 from fuse 450, such as in a cell 465. Then, from array 460, configuration data 452 is input in operational component 430.

In the above examples, as configuration data 452 is moved, it may change nature, or what it encodes. For example, while on fuse 450, data 452 may be in the form of a charge stored on a floating gate. By the time it is stored in a cell, such as cell 465, it may have become a binary bit such as 1 or 0, depending on the application.

Returning to FIG. 4A, configuration data 452 may become available to operational component 430 in any number of ways. In some embodiments, configuration data 452 is always available to operational component 430, such as by the requisite connections.

In other embodiments, operational component 430 inputs configuration data 452 responsive to a command signal CMD. Any one type of a command signal may be used, such as a reset signal, a power-on reset (POR) signal, and so on. For a POR signal, a POR circuit would be provided on circuit 425, etc. In addition, a command signal may be generated during testing, whether a tag is tested individually, or while still on a wafer, as is described below.

Figure 5:
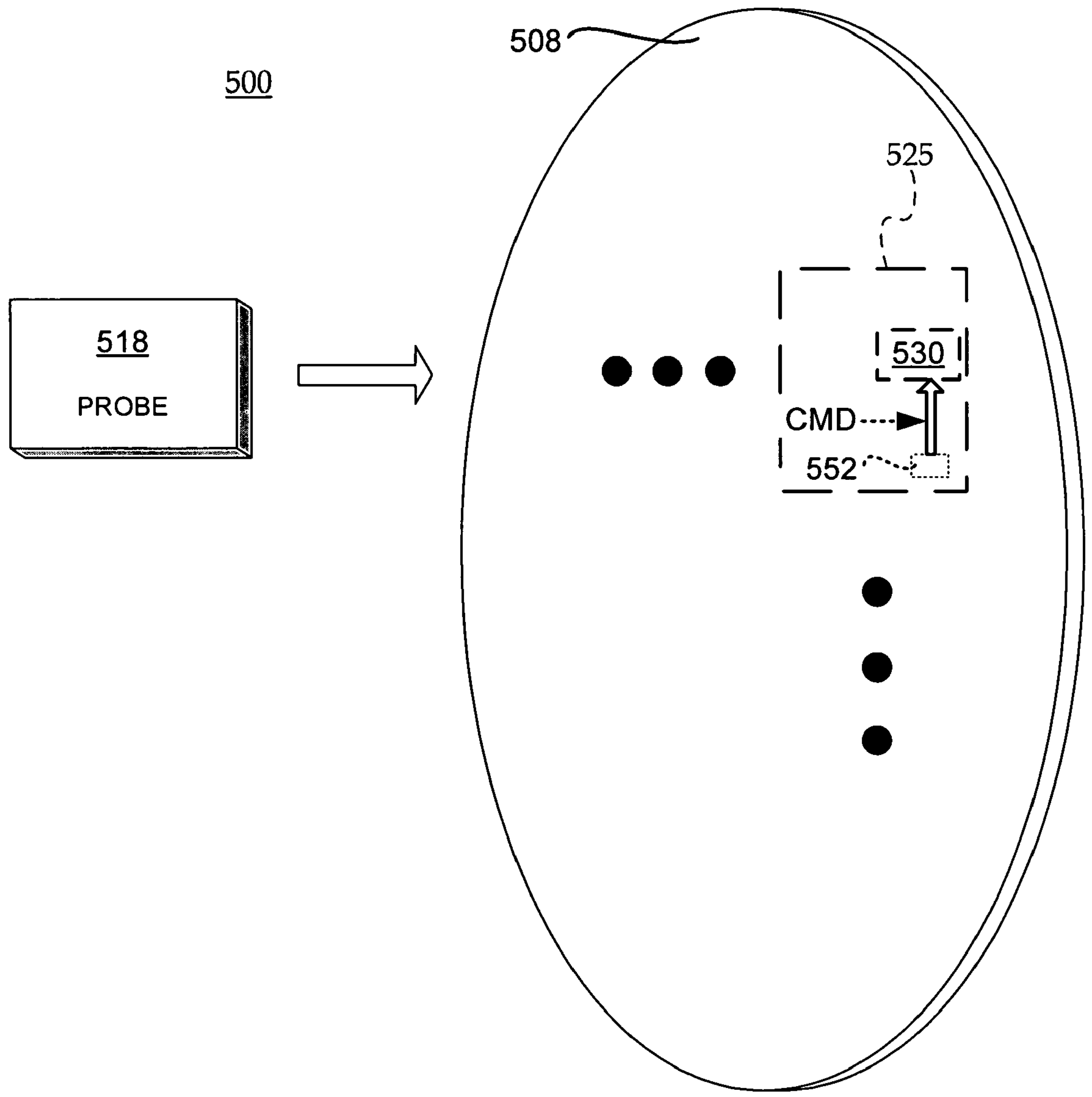
FIG. 5 is a perspective diagram of a wafer being tested by a probe.

FIG. 5 is a perspective diagram of a wafer 508 being tested and/or initialized by a probe 518. Wafer 508 includes many RFID tag circuits, such as circuit 525, which are tested by probe 518. After testing and/or initializing, wafer 508 is to be cut such that a standalone small chip would include circuit 525. The exact configuration for testing and cutting is implemented any way known in the art. Alternately, the wafer may be cut into segments, and then one or more circuits per segment may be tested. Then the segment may be cut into individual chips.

Circuit 525 includes an operational component 530, similar to operational component 430 described above. Operational component 530 is adapted to input configuration data 552 during testing and/or initializing responsive to a command signal CMD, similarly to what was described above. In addition, command signal CMD in the embodiment of FIG. 5 may be generated by an action of probe 518. For example, probe 518 may apply the proper signals to circuit 525 to activate certain components, and so on. Or probe 518 may furnish configuration data 552, and so on.

Figure 6A:
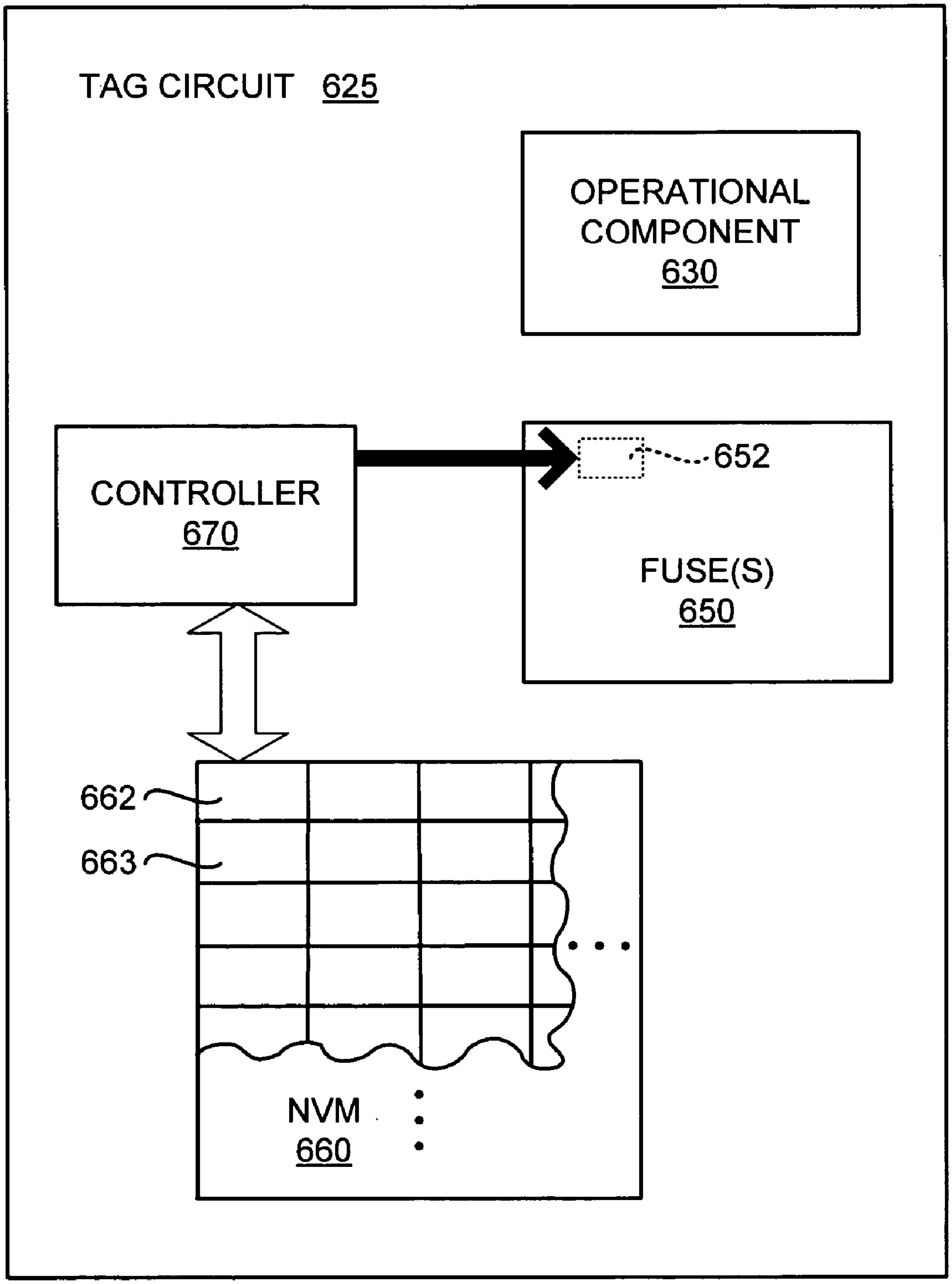
FIG. 6A is a block diagram of salient components of an RFID tag circuit according to other embodiments of the invention, where a controller is used to program configuration data in a fuse.

FIG. 6A is a block diagram of salient components of an RFID tag circuit according to another embodiment of the invention. A tag circuit 625 includes a NVM memory array 660, similar to array 460. Two NVM cells 662, 663 of array 660 are shown.

Tag circuit 625 also includes an operational component 630, similar to operational component 430. Operational component 630 operates based on configuration data.

Tag circuit 625 additionally includes a fuse 650, similar to embodiments of fuse 450. Fuse 650 stores configuration data 652, which is the configuration data for operational component 630. Fuse 650 is programmable as necessary.

Tag circuit 625 moreover includes a controller 670. Controller 670 is adapted to program configuration data 652 in fuse 650. In addition, controller 670 may cooperate with other components, such as operational component 630, NVM memory array 660, and so on.

In a number of embodiments, controller 670 is adapted to determine what configuration data 652 to program in fuse 650. Two examples are described below.

Figure 6B:
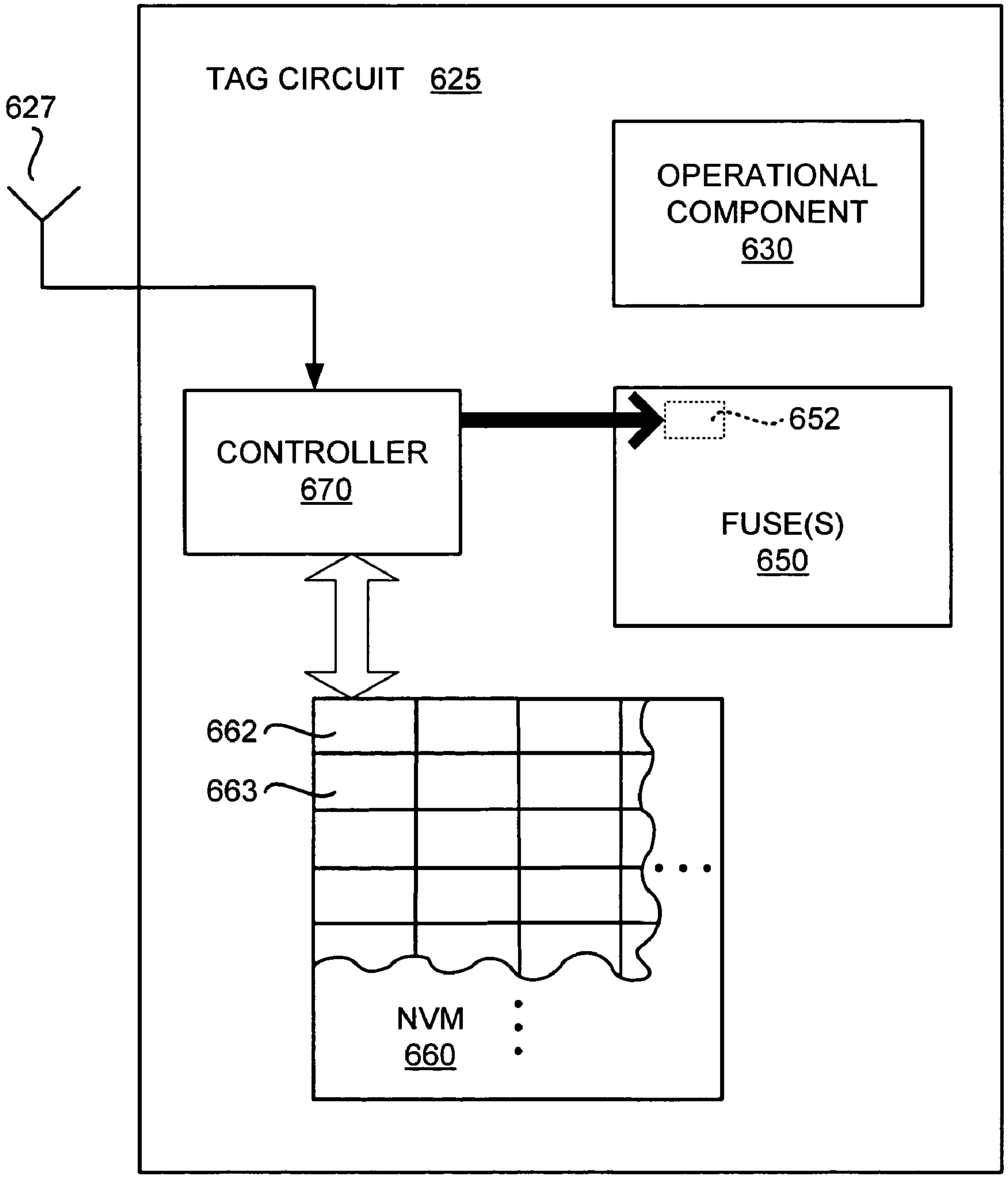
FIG. 6B is the block diagram of FIG. 6A, and further showing an embodiment of how the controller determines what configuration data to store in the fuse.

FIG. 6B shows again tag circuit 625 of FIG. 6A. In addition, circuit 625 includes an antenna 627, which can be the antenna of the RFID tag. Antenna 627 is adapted to receive a wireless signal, and controller 670 determines configuration data 652 from the received wireless signal.

Figure 6C:
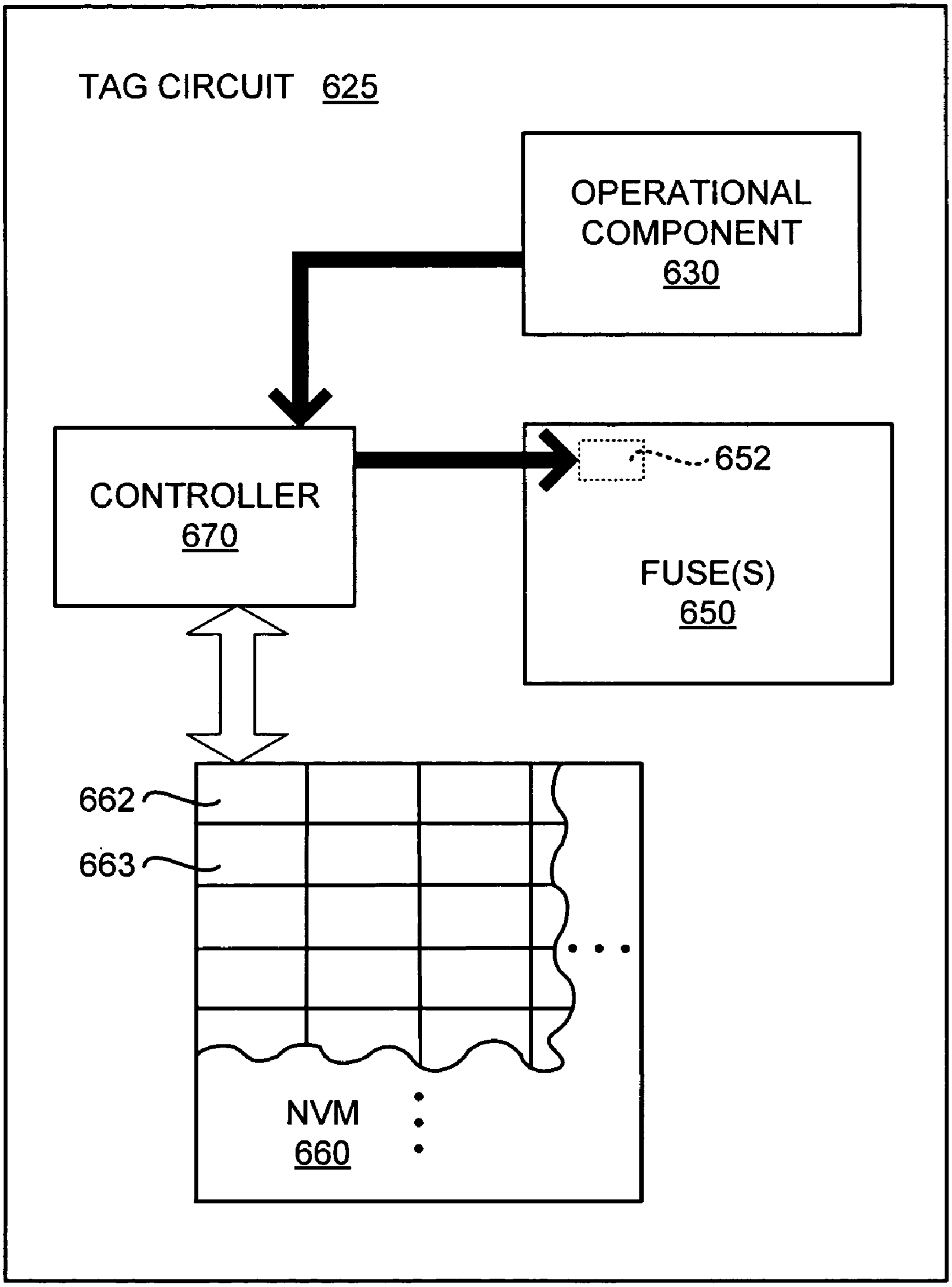
FIG. 6C is the block diagram of FIG. 6A, and further showing another embodiment of how the controller determines what configuration data to store in the fuse.

FIG. 6C shows again tag circuit 625 of FIG. 6A. In addition, controller 670 is adapted to sense a performance of operational component 630. Controller 670 then determines configuration data 652 so as to adjust the performance. The performance may be optimized, if needed. In some instances, adjusting can be to diminish the performance if, for example, more privacy is required.

This feature of determining what configuration data 652 to program be invoked spontaneously, autonomously, in response to a received command, and so on. Adjusting may be desired if the performance has changed, for example either due to the passage of time, or due to changed environmental conditions, and so on. Adjusting may also take place while manufacturing or testing a tag, or preparing it for field use. For example, the processor may step through a number of values to adjust the antenna reception.

Configuration data 652 may be input in operational component 630 via any number of paths. For example, configuration data 652 may be input in operational component 630 directly from fuse 650, similarly to what was described above with reference to FIG. 4B. Or configuration data 652 may be first routed via NVM array 660, similarly to what was described above with reference to FIG. 4C.

Figure 6D:
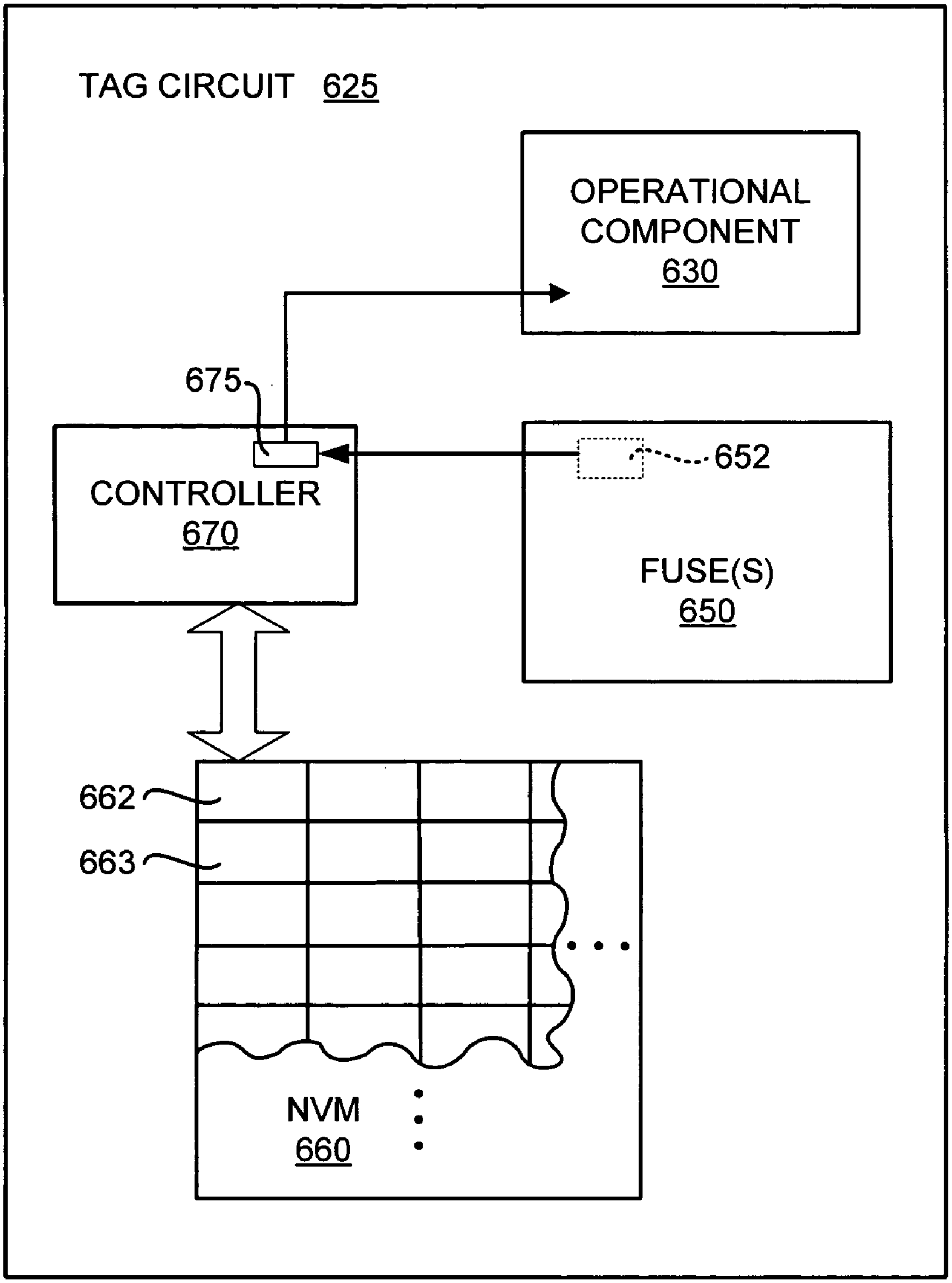
FIG. 6D is the block diagram of FIG. 6A, and further showing yet another embodiment of how stored configuration data is input in an operational component.

In one more example, FIG. 6D shows again tag circuit 625 of FIG. 6A. In the embodiment of FIG. 6D, configuration data 652 is input in operational component 630 indirectly. Before being input in operational component 630, configuration data 652 is routed through any suitable component. In the particular example of FIG. 6D, configuration data 652 is first input in controller 670, such as in a register 675. Then, from controller 670, configuration data 652 is input in operational component 630.

As written above, operational component 430, 530, 630 may be any one or more of any of the tag circuit components. If more than one, then a plurality of configuration data is stored. For each one of the possible operational components, one or more of their operation or performance characteristics may be controlled and/or changed by the configuration data. A number of examples are illustrated below, while manners of controlling are described later in this document.

Figure 7A:
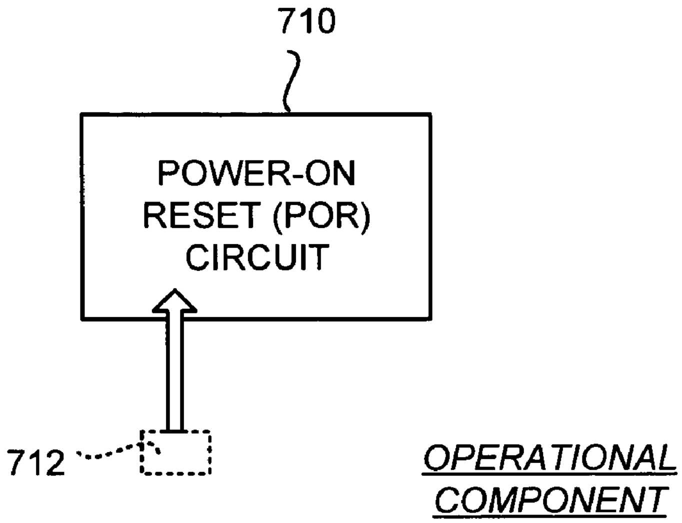
FIG. 7A is a block diagram of a first possible embodiment of an operational component shown in FIG. 4A, FIG. 5, and FIG. 6A.

FIG. 7A is a block diagram of an embodiment of an operational component that is a power-on reset (POR) circuit 710. This can be the same circuit that outputs the POR pulse described above. Configuration data 712 may control any operational parameter of POR circuit 710, such as a reset threshold.

Figure 7B:
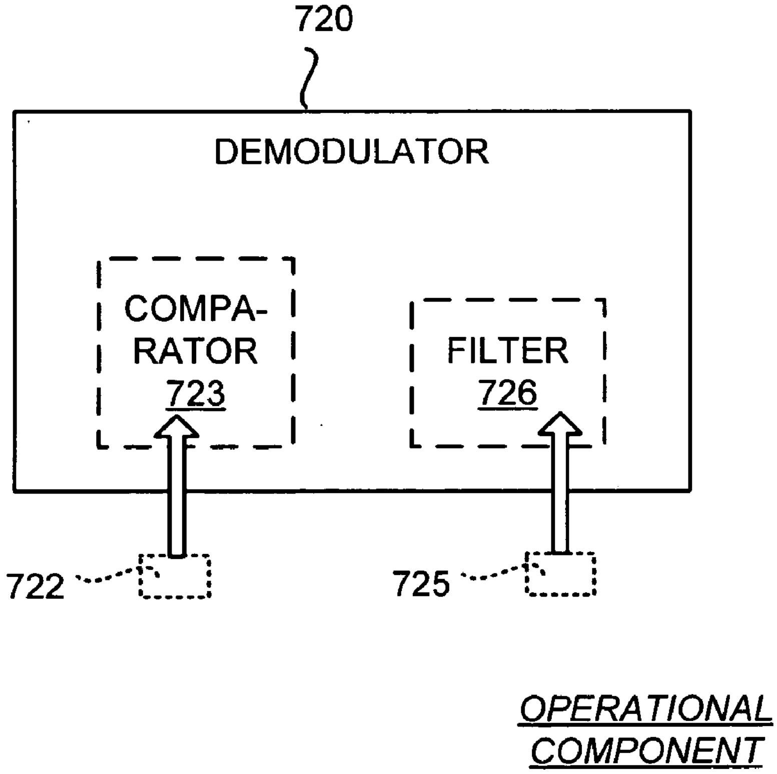
FIG. 7B is a block diagram of additional possible embodiments of an operational component shown in FIG. 4A, FIG. 5, and FIG. 6A.

FIG. 7B is a block diagram of an embodiment of an operational component that is a demodulator 720. Configuration data may control any number of operational components of demodulator 720. For example, configuration data 722 may control a comparator 723, configuration data 725 may control a filter 726, and so on.

Figure 7C:
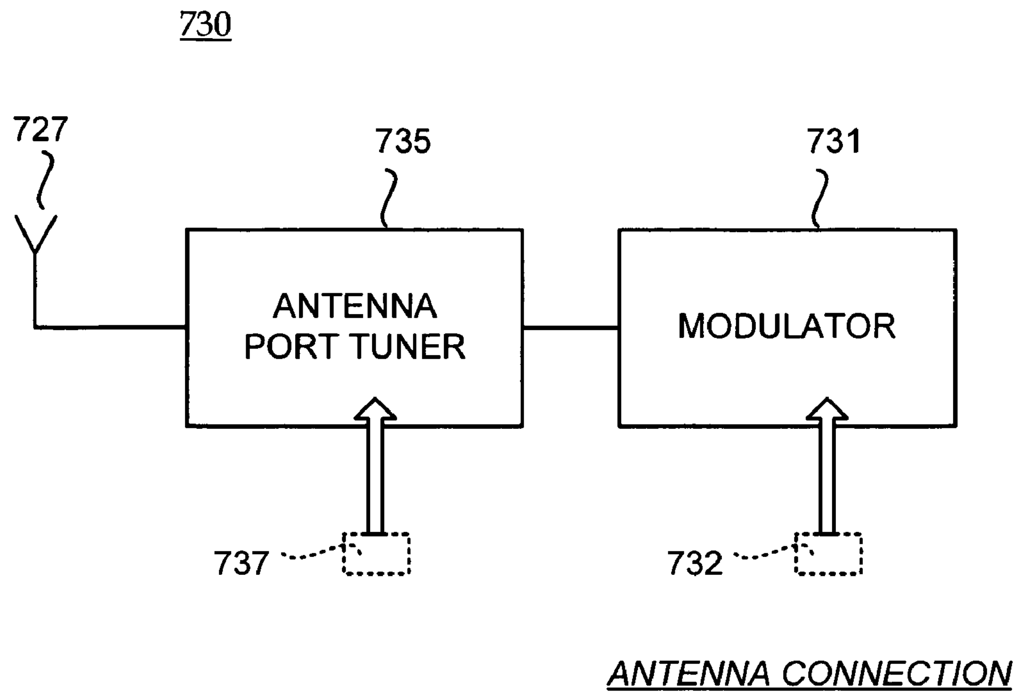
FIG. 7C is a block diagram of further possible embodiments of an operational component shown in FIG. 4A, FIG. 5, and FIG. 6A.

FIG. 7C is a block diagram of an embodiment of an antenna connection 730. Connection 730 as shown is used for outputting data by backscattering.

Connection 730 may involve an antenna 727, an operational component that is a modulator 731, and an operational component that is an antenna port tuner 735. Configuration data may control either modulator 731, or antenna port tuner 735, or both. For example, configuration data 732 may control any operational parameter of modulator 731, such as modulation depth and/or transmitted backscattered signal power. In addition, configuration data 737 may control any operational parameter of antenna port tuner 735, such as its impedance. In this case, the impedance may have adjustable reactance components, such as capacitance and inductance. And again, the distinction is repeated that modulator 731 would output via backscattering data other than configuration data 732.

Figure 7D:
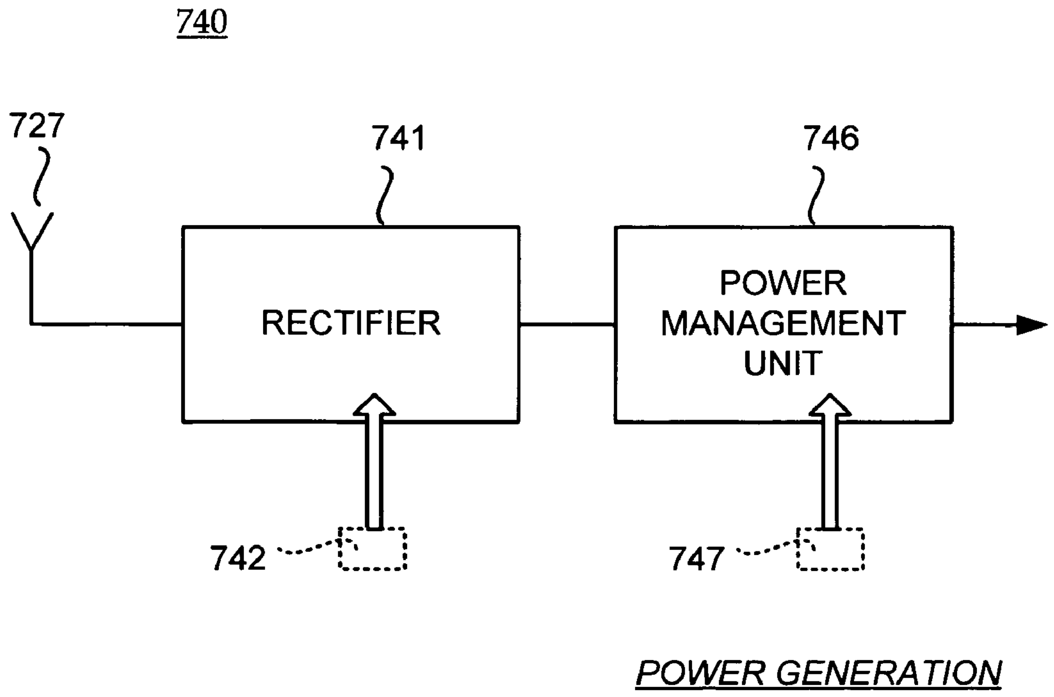
FIG. 7D is a block diagram of additional possible embodiments of an operational component shown in FIG. 4A, FIG. 5, and FIG. 6A.

FIG. 7D is a block diagram of an embodiment of a power generation circuit 740. Circuit 740 as shown is used for generating electrical power for the tag.

Circuit 740 may involve antenna 727, an operational component that is a rectifier 741, and an operational component that is a power management unit (PMU) 746. Configuration data may control either rectifier 741, or PMU 746, or both. For example, configuration data 742 may control any operational parameter of rectifier 741, and configuration data 747 may control any operational parameter of PMU 746.

Figure 7E:
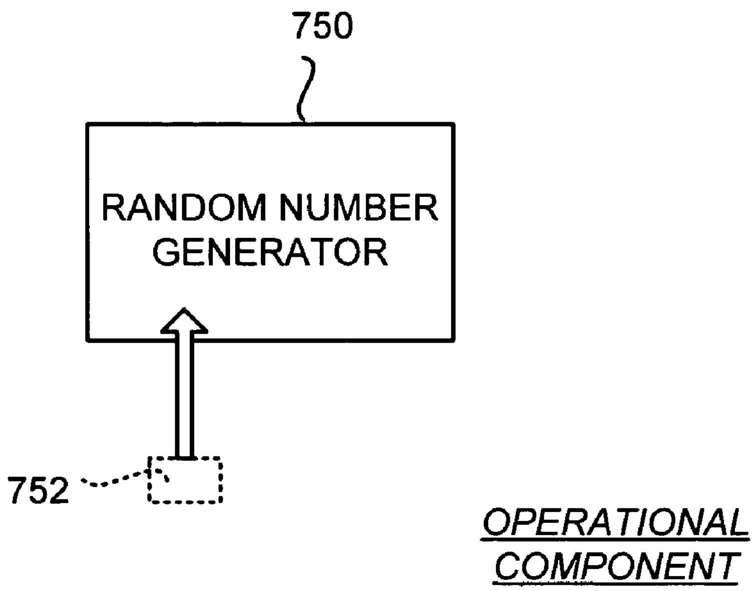
FIG. 7E is a block diagram of one more possible embodiment of an operational component shown in FIG. 4A, FIG. 5, and FIG. 6A.

FIG. 7E is a block diagram of an embodiment of an operational component that is a random number generator (RNG) 750. Configuration data 752 may control any operational parameter of RNG 750, such as to supply an encoded seed for generating random numbers.

Figure 7F:
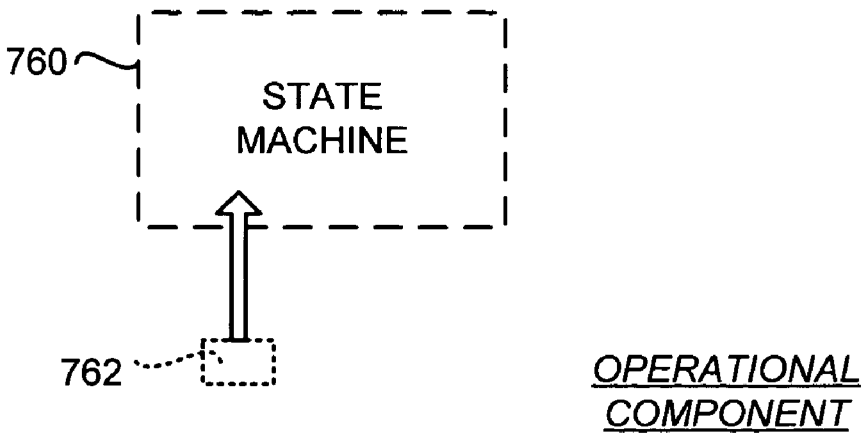
FIG. 7F is a block diagram of another possible embodiment of an operational component shown in FIG. 4A, FIG. 5, and FIG. 6A.

FIG. 7F is a block diagram of an embodiment of an operational component that is a state machine 760. Configuration data 762 may control any operational parameter of state machine 760.

State machine 760 may be a standalone state machine for the whole tag. Or it may be a state machine for an operational component, such as those described in this document. For example, it may be a state machine of NVM memory array 660. Or it may be a state machine of controller 670.

In some embodiments, an operational component is to receive one of a number of available clocks signals. In these embodiments, a state machine for the operational component includes a multiplexer. The multiplexer may receive configuration data in the form of one or more bits. The received bits control which one of the available clocks signals is received through the multiplexer. In the event where there are only two clock signals, only a single bit is needed.

In some embodiments, state machine 760 deals with whether a tag has the feature of backscattering continuously, and how to address a reader command to do so. Backscattering continuously would be performed in a testing mode, for measuring the backscattered power. During that mode, contrary to what is shown in FIG. 3, the tag would be backscattering even during the R→T sessions 312.

In some embodiments, configuration data 762 can encode one of two values. The first value indicates that a backscatter continuously feature is available, while the second value indicates that it is not. Various combinations, features, or alternative approaches are possible.

In a number of embodiments, configuration data 762 causes the tag to ignore a command by a reader to backscatter continuously. That embodiment is particularly useful where the tag is not capable of backscattering continuously, or has been otherwise programmed not to.

In other embodiments, configuration data 762 causes the tag to be in a state of backscattering continuously. That embodiment would be useful in a situation where performing such testing is desired, or in jurisdictions where such testing is required. In one of these embodiments, configuration data 762 is enabled when a test command is received. In another one of these embodiments, configuration data 762 is enabled at power up, for example in response to a POR signal.

In yet other embodiments, configuration data 762 causes the tag to react to a command by a reader to backscatter continuously. Reacting can be by issuing a response, such as non-compliance or intended compliance.

Figure 7G:
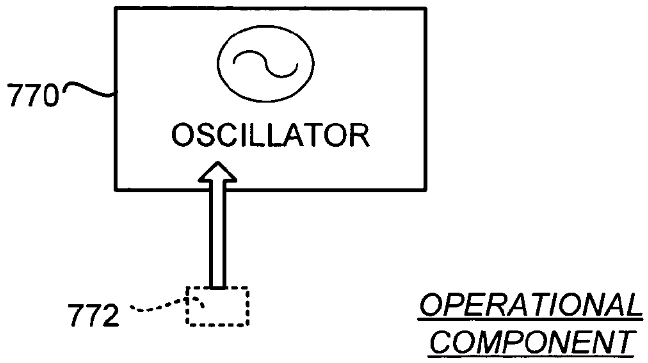
FIG. 7G is a block diagram of one more possible embodiment of an operational component shown in FIG. 4A, FIG. 5, and FIG. 6A.

FIG. 7G is a block diagram of an embodiment of an operational component that is an oscillator 770. Oscillator 770 may also be known as a clock signal generator, or may be a part of a clock signal generator. Configuration data 772 may control any operational parameter of oscillator 770, or a broader clock signal generator.

Figure 7H:
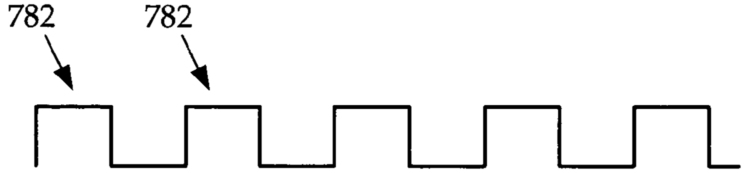
FIG. 7H, FIG. 7I, and FIG. 7J, are possible timing diagrams output by an oscillator of FIG. 7G, as a result of receiving different configuration data.
Figure 7I:
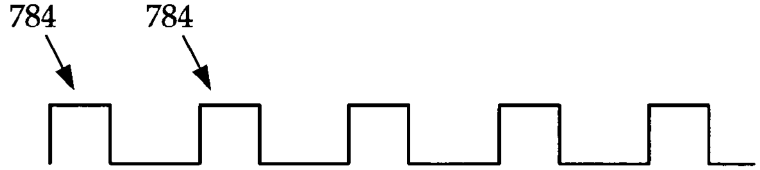
Figure 7J:
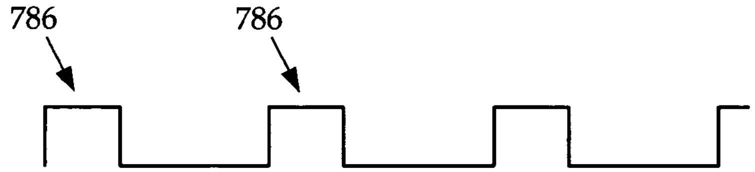

FIG. 7H, FIG. 7I, and FIG. 7J, are possible timing diagrams output by oscillator 770, or an associated clock signal generator, as a result of inputting different configuration data 772. These timing diagrams are given so that the impact of different configuration data 772 will be better appreciated.

FIG. 7H shows a first possible output of oscillator 770, which includes successive pulses 782.

FIG. 7I shows a second possible output of oscillator 770, which includes successive pulses 784. Pulses 784 have the same frequency, but a different duty cycle than pulses 782 of FIG. 7H.

FIG. 7J shows a third possible output of oscillator 770, which includes successive pulses 786. Pulses 786 have a different frequency than pulses 782 of FIG. 7H.

Differences in generated pulses such as the above are attained by inputting different configuration data 772 in oscillator 770. Such can be inputted in different ways, for example adjusting an impedance, directly or indirectly, and so on.

In some embodiments, a Voltage Controlled Oscillator (VCO) is used, where adjusting a voltage adjusts a frequency. The VCO can be controlled by voltage output from a Digital to Analog Converter (DAC), which in turn can receive configuration data in the form of a binary input (one or more bits).

In other embodiments, a Current Controlled Oscillator (CCO) is used, preferably as controlled by a current-output Digital to Analog Converter (DAC). Again the DAC can receive configuration data in the form of a binary input. A "current-starved ring oscillator" is one common, well-known example of a current-controlled oscillator.

In further embodiments, oscillator 770 is implemented by at least one or more delay cells, whose delay can be affected by configuration data, such as input bits. A versatile embodiment includes at least two delay cells. If the bits affect the delay cells in the same direction, the frequency is adjusted. If the bits affect the delay cells in opposite directions, the frequency may stay the same, but the duty cycle is adjusted.

Figure 8:
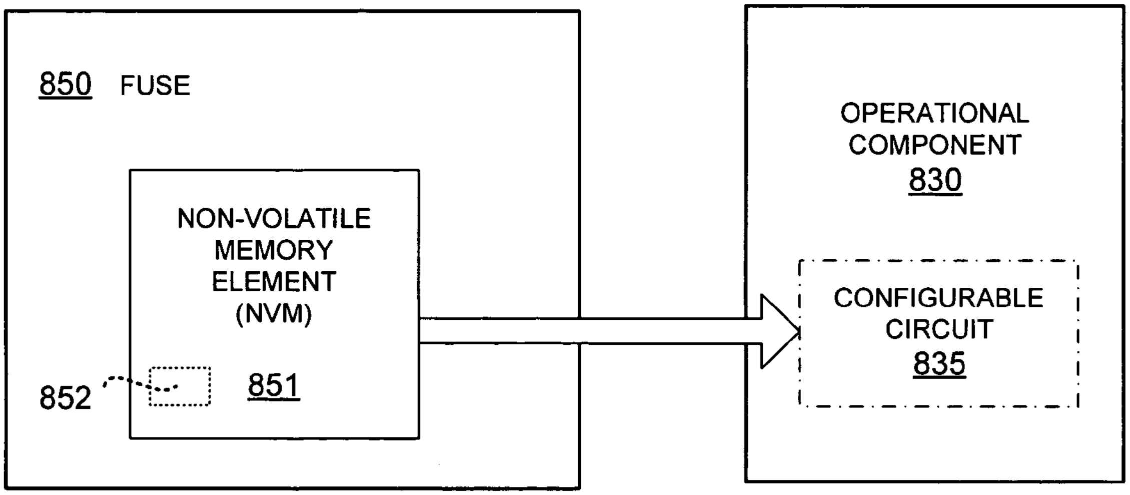
FIG. 8 is a block diagram illustrating embodiments of how an operational component can be controlled by configuration data.

FIG. 8 is a block diagram illustrating embodiments of how an operational component can be controlled by configuration data. In FIG. 8, a fuse 850 stores configuration data for an operational component 830. It will be understood that FIG. 8 can apply similarly to types of implementations where fuse 850 is considered separate from, or a part of operational component 830.

Fuse 850 includes a nonvolatile memory (NVM) element 851 for storing configuration data 852. A number of possible implementations are described below.

Operational component 830 may be any operational component in an RFID tag circuit, such as one of the components described above. In addition, operational component 830 is considered to include a configurable circuit 835 that is responsive to configuration data 852. Configurable circuit 835 can be adapted to exhibit a characteristic that varies according to different values encoded in configuration data 852. In a basic embodiment, the configurable circuit includes an ON/OFF switch. In one embodiment, configurable circuit 835 includes a state machine, as also per the above.

Various embodiments of the implementation of FIG. 8 are now described in more detail.

First, for NVM element 851, a number of embodiments are possible. For example, NVM element 851 can use a mechanism for nonvolatile storage of information that is magnetoresistive, ferroelectric, phase-change, dielectric, and so on.

Alternately, NVM element 851 of FIG. 8 can be implemented by a transistor that stores charge in a floating gate, such as a CMOS transistor. The transistor can be nFET, pFET, FinFET, multi-gate FET, and so on. In addition, more implementation details for these items can also be found in the incorporated three co-pending patent applications, mentioned at the beginning of this document.

A particular example is now described, of a transistor that stores charge in a floating gate, such as a CMOS transistor. The following description is to be viewed also in terms of the above incorporated references.

Figure 9:
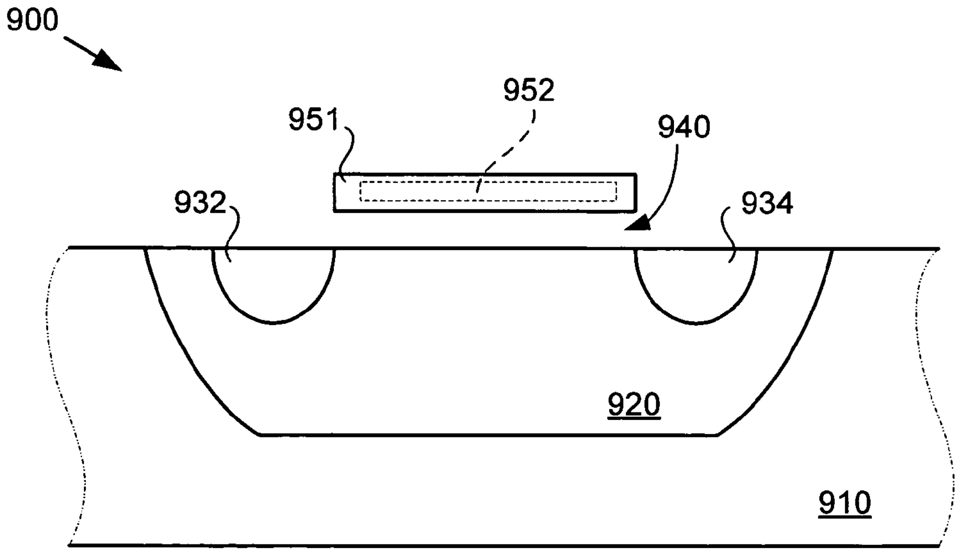
FIG. 9 is a cross sectional diagram of a FET device with a floating gate that can serve as a NVM element of FIG. 8.

FIG. 9 is a cross sectional diagram of a FET transistor device 900. For the present description, transistor 900 can be of either the pnp polarity, or the npn polarity. Where multiple transistors are called for, either or both polarities may be used. The description of the three incorporated applications proceeds mostly in terms of one of the two polarities, but these are presented as an illustration, and not as a limitation. Indeed, one can interchange the n and the p polarities recited in the three incorporated applications to practice the present description.

Transistor device 900 is formed in a semiconductor substrate 910. A doped well 920 is formed in semiconductor substrate 910. A heavily doped source region 932 and a heavily doped drain region 934 are formed in well 920, defining a channel between them. A dielectric insulating layer (not shown) is formed in an area 940 over the channel. A gate 951 is formed over area 940, which hosts an electrical charge 952. Gate 951 is called a floating gate, because it has a voltage that changes ("floats"), depending on the changing amounts of the electrical charge 952.

In the embodiment of FIG. 9, the NVM element (shown as 851 in FIG. 8) includes floating gate 951 of floating-gate transistor 900. Configuration data (shown as 852 in FIG. 8) is encoded in terms of the amount of charge 952 be stored on floating gate 951.

In one embodiment, the NVM element includes two transistors. Beyond transistor 900, the NVM element includes a second transistor. In some embodiments, the second transistor operates in a differential mode with transistor 900.

For transistor 900, programming a different value for the configuration data can be performed by changing the amount of charge 952 on floating gate 951. The charge may be changed by any number of ways, accomplished by building suitable structures and operating suitable circuits for transistor 900. These ways include Fowler-Nordheim tunneling, bidirectional Fowler-Nordheim tunneling, hot-electron injection, direct tunneling, hot-hole injection, ultraviolet radiation exposure, and so on.

Returning briefly to FIG. 8, configurable circuit 835 of operational component 830 may exhibit a characteristic that varies according to different values encoded in configuration data 852. In some embodiments, the variable characteristic is an operative impedance. As is well known, impedance includes any combination of electrical resistance and reactance. The reactance includes any combination of inductance and capacitance. In the above mentioned example of an ON/OFF switch, resistance might simply take two values, one very small (ON) and one very large (OFF).

Various examples are now described of varying impedance according to configuration data. These include varying the impedance continuously and also discretely.

Figure 10:
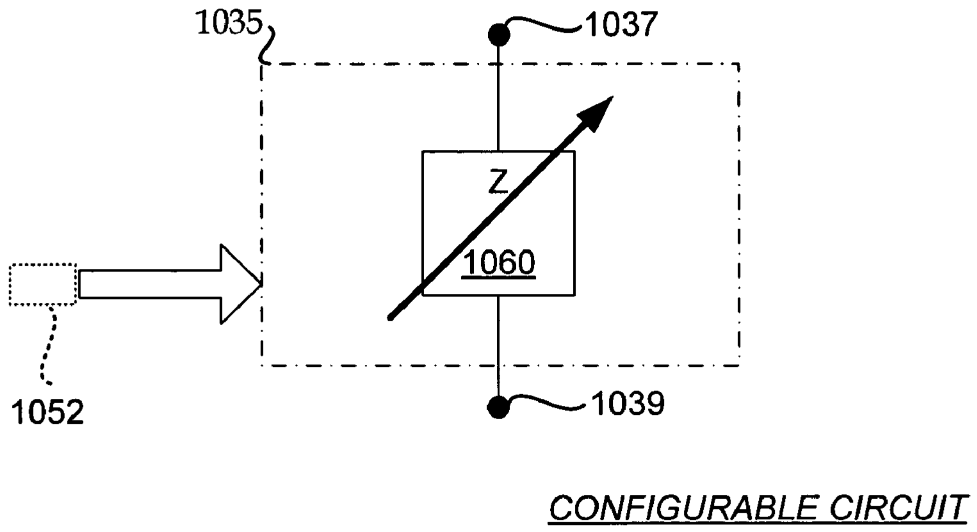
FIG. 10 is a combination electrical schematic, block and conceptual diagram showing a possible implementation of the configurable circuit of FIG. 8, where an operative impedance is continuously variable.

FIG. 10 is a combination electrical schematic, block and conceptual diagram showing a possible implementation of a configurable circuit 1035, having terminals 1037 and 1039. Circuit 1035 has a block 1060 between terminals 1037, 1039. An operative impedance Z of block 1060 is continuously variable, as controlled by configuration data 1052.

Controlling the impedance can be performed in any number of ways. One such way is described below, where the NVM element 851 of FIG. 8 includes a floating gate of a floating-gate transistor.

Figure 11:
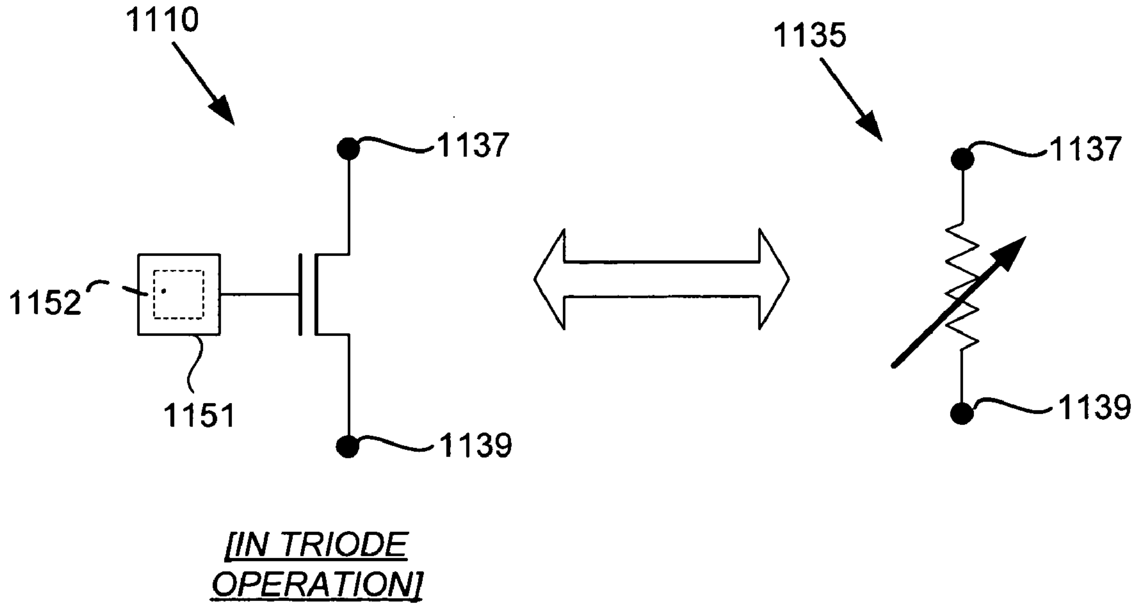
FIG. 11 is a schematic diagram of a floating-gate transistor that can be used in a circuit to implement the operative impedance of FIG. 10.

FIG. 11 is a schematic diagram of a floating-gate transistor 1110 that can be used in a circuit to implement the operative impedance of block 1060. Transistor 1110 may be made as was described above, with reference to transistor 900. Transistor 1110 is adapted to be in triode operation, by proper biasing, and so on. Transistor 1110 includes a floating gate 1151, and the impedance between its source terminal 1137 and drain terminal 1139 is controlled by a variable amount of charge 1152 on floating gate 1151. Accordingly, transistor 1110 behaves similarly to resistor 1135.

Figure 12:
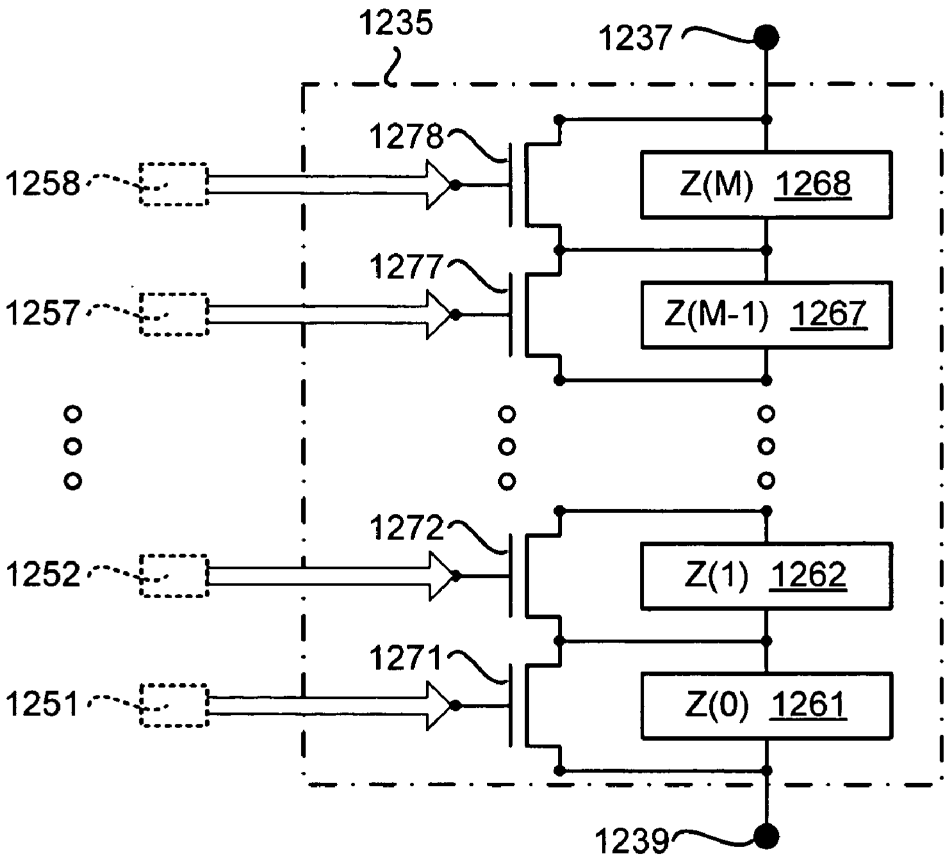
FIG. 12 is a combination electrical schematic and block diagram showing a possible implementation of the configurable circuit of FIG. 8, where an operative impedance is discretely variable.

FIG. 12 is a combination electrical schematic and block diagram, showing a possible implementation of a configurable circuit 1235, having terminals 1237 and 1239. Between terminals 1237 and 1239 there are M+1 impedance blocks or components Z(0) 1261, Z(1) 1262, . . . , Z(M−1) 1267, and Z(M) 1268, where M is an integer.

While the embodiment of FIG. 12 shows impedance blocks Z(0) 1261, Z(1) 1262, . . . , Z(M−1) 1267, and Z(M) 1268 in series, other implementations are also possible. For example, parallel combinations are possible, as well as series parallel combinations.

FIG. 12 also shows switches 1271, 1272, . . . , 1277, and 1278, which may be implemented by transistors, such as FET transistors and so on. Switches 1271, 1272, . . . , 1277, and 1278 can individually switch ON and OFF, so that they can allow respective individual impedance blocks Z(0) 1261, Z(1) 1262, . . . , Z(M−1) 1267, and Z(M) 1268 to be part of the total impedance between terminals 1237 and 1239, or be bypassed. This way, the operative impedance between terminals 1237 and 1239 is discretely variable, each time determined by accounting for the individual impedances of those of impedance blocks Z(0) 1261, Z(1) 1262, . . . , Z(M−1) 1267, and Z(M) 1268 that are not bypassed. In some of these embodiments, it is advantageous to choose the impedance values of blocks Z(0) 1261, Z(1) 1262, . . . , Z(M−1) 1267, and Z(M) 1268 to be multiples of each other, so that a range can be covered.

Switches 1271, 1272, . . . , 1277, and 1278 can be individually switched ON and OFF depending on respective configuration data 1251, 1252, . . . 1257, 1258. It will be appreciated that such an arrangement does not use a single value of configuration data, but multiple values of configuration data 1251, 1252, . . . 1257, 1258. In addition, configuration data 1251, 1252, . . . 1257, 1258 can have a binary character, because all they are required to do is switch switches 1271, 1272, . . . , 1277, and 12780N and OFF. And they can be considered to form a single number, such as a multi-bit binary number.

In general, configuration data 1251, 1252, . . . 1257, 1258 can be applied to control switches 1271, 1272, . . . , 1277, and 1278 in any number of ways. One such way is as shown in FIG. 11, but that is not preferable. Instead, it is preferable that switches 1271, 1272, . . . , 1277, and 1278 be implemented by transistors that operate in an ON/OFF region. This can be implemented by incorporating binary output circuits, as will be described later in this document.

Returning briefly to FIG. 7G, oscillator 770 may be implemented by an LC (inductor-capacitor), RC (resistor capacitor), ring oscillator, and so on. A frequency and or/duty cycle can be adjusted by adjusting an operative impedance, for example a resistance, a capacitance, a product of resistance and capacitance, and so on.

For another example, in one embodiment, the oscillator frequency can depend on the product of a capacitance (that is not changed) and the resistance of a transistor in the triode region of operation. The bias point of the transistor in triode operation depends on a bias circuit, which in turn depends on a resistor. Switches short out parts of the resistor in the bias circuit, which then affects the bias point of the triode transistor, and in turn changes the frequency. Depending on where boundaries are considered, such a complex implementation looks either like a resistor-controlled oscillator, or a resistor-controlled current DAC that drives a current-controlled oscillator, or a resistor-controlled voltage DAC that drives a VCO, and so on.

Figure 13:
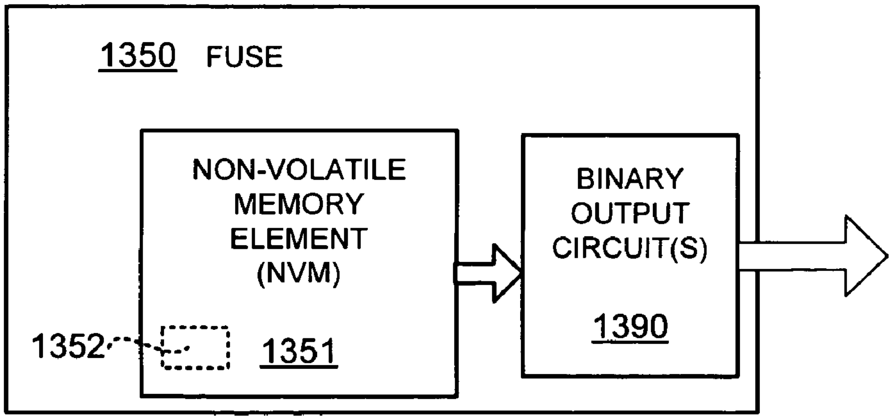
FIG. 13 is a block diagram of a possible implementation of a fuse, according to embodiments of the invention.

FIG. 13 is a block diagram of a possible implementation of a fuse 1350, according to embodiments of the invention. Fuse 1350 may be used, for example, to implement any one or more of fuses 450, 650, and 850. And fuse 1350 is preferable for using with switches 1271, 1272, . . . , 1277, and 1278 of FIG. 12, which are intended to operate in a binary fashion.

Fuse 1350 includes a binary output circuit 1390 coupled to a NVM element 1351, which is made as described above. Binary output circuit 1390 therefore outputs a binary value dependent on configuration data 1352 stored in NVM element 1351. As such, a tag operational component (not shown in FIG. 13) coupled to fuse 1350 receives the binary value. Accordingly, if used in FIG. 12, a binary output circuit will control switches 1271, 1272, . . . , 1277, and 1278. These in turn will control which ones of impedance components Z(0) 1261, Z(1) 1262, . . . , Z(M−1) 1267, and Z(M) 1268 will be part of the total operative impedance between terminals 1237, 1239.

Binary output circuit 1390 may be implemented in any number of ways. For example, circuit 1390 may be a logic circuit, such as a gate, a latch, or a buffer. As a latch, it may be implemented in any number of ways, as is also explained in more detail in the above mentioned three incorporated co-pending patent applications. For example, the latch can have two cross-coupled inverters. Or it can have a master latch, and a slave latch having a slave-latch input coupled to an output of the master latch. In the latter case, the slave latch can further have a slave-latch node configured to receive a slave-latch signal.

Variations of the fuse of FIG. 13 may be also be implemented. Two examples are described below.

Figure 14:
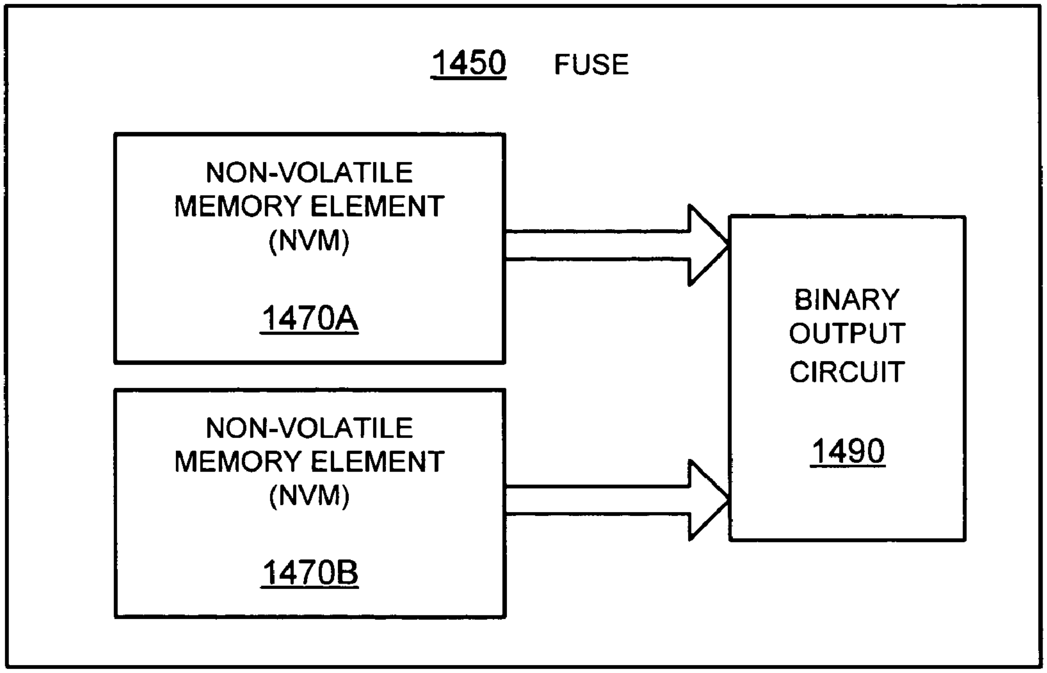
FIG. 14 is a block diagram showing a first possible variation of the fuse of FIG. 13, according to an embodiment of the invention.

FIG. 14 is a block diagram showing a first possible variation of fuse 1350. A fuse 1450 includes two NVM elements 1470A, 1470B, and a binary output circuit 1490. This way, binary output circuit 1490 outputs a binary value dependent on configuration data that is stored in both NVM elements 1470A, 1470B.

Figure 15:
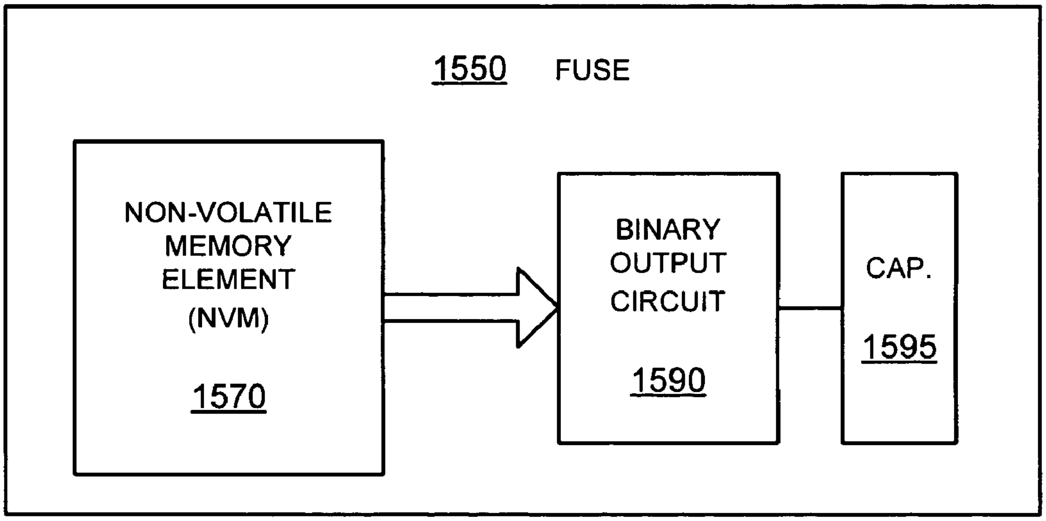
FIG. 15 is a block diagram showing a second possible variation of the fuse of FIG. 13, according to another embodiment of the invention.

FIG. 15 is a block diagram showing a second possible variation of fuse 1350. A fuse 1550 includes a binary output circuit 1590 coupled to a NVM element 1570. A capacitive element 1595 is coupled to an output of binary output circuit 1590. Capacitive element 1595 may be a single capacitor. Binary output circuit 1590 therefore outputs a binary value dependent on configuration data stored in NVM element 1570, and that output is received by capacitive element 1595.

Figure 16:
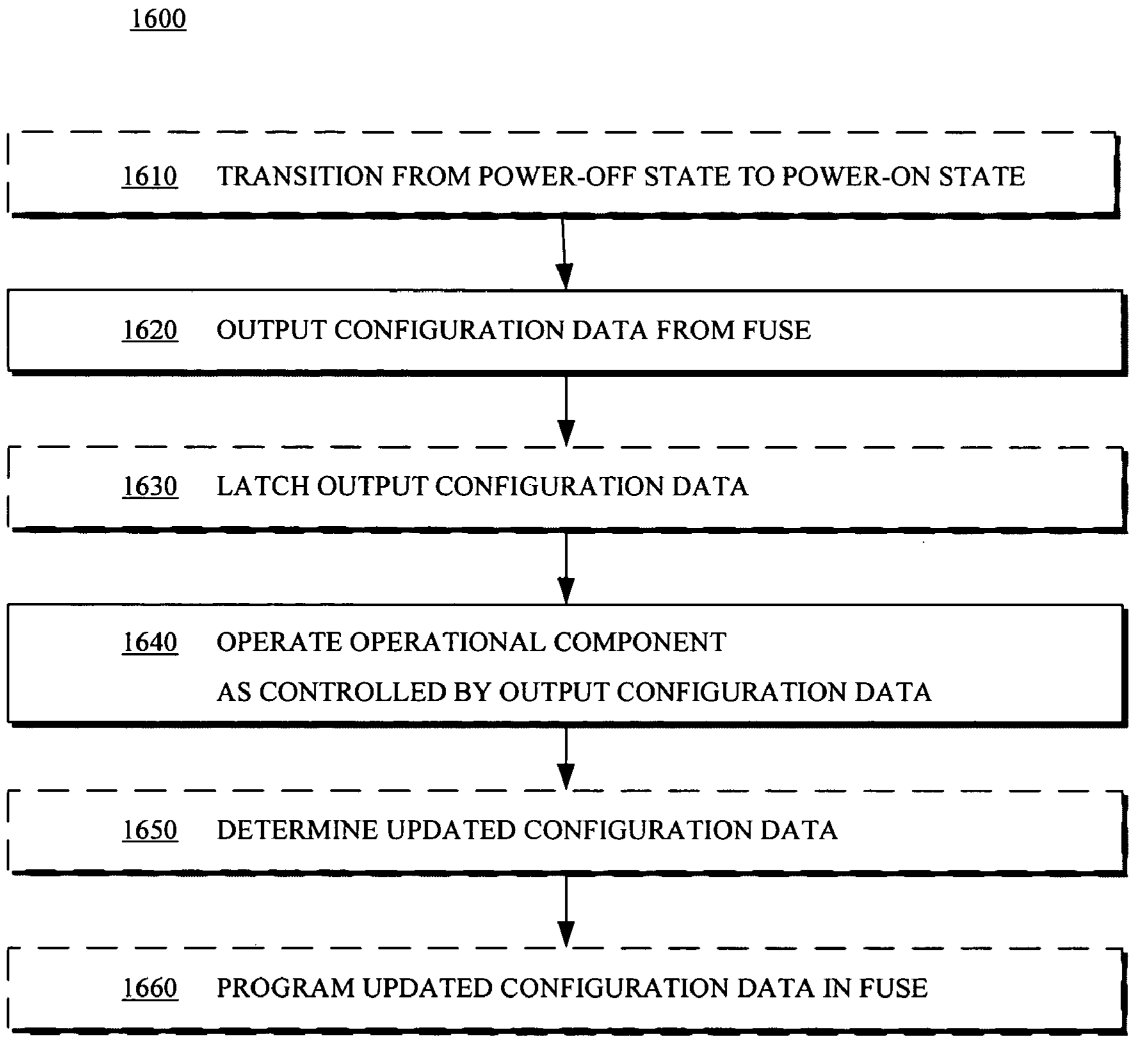
FIG. 16 is a flowchart illustrating a method according to an embodiment of the present invention.

FIG. 16 is flowchart 1600 illustrating a method according to an embodiment of the invention. The method of flowchart 1600 may also be practiced by different tags circuits, including but not limited to circuits 425, 525, 625.

A number of blocks are optional, and are mostly of interest when the method is practiced at power up, i.e. when power is initially received.

At optional block 1610, there is a transition from a power-off state to a power-on state. This can take place especially at power up, when RF power is initially received through antennas.

At next block 1620, programmed configuration data is output from a fuse of the tag circuit. At optional next block 1630, the configuration data is latched, such as in a binary output circuit. As per the above, the binary output circuit can be a latch, buffer or gate, and so on.

At next block 1640, an operational component of the tag circuit is operated as controlled by the output configuration data. Preferably, the data output from the fuse is input in the operational component. If the data has been latched, it is input from the latch.

In some embodiments, the operational component is operated as controlled by an exhibited characteristic of a configurable circuit of the component. The characteristic is variable and dependent on the input configuration data, as per the above.

At optional next block 1650, updated configuration data is determined for programming in the fuse. Determining takes place as described above.

At optional next block 1660, configuration data is programmed in the fuse, such as updated configuration data.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements and/or properties may be presented in this or a related document.

What is claimed is:

1. An RFID tag circuit comprising:

a fuse adapted to store configuration data in a way that survives loss of power, the fuse including a nonvolatile memory (NVM) element for storing the configuration data, the fuse further including a fuse switch;

an operational component adapted to operate based on the configuration data, the operational component including a configurable circuit adapted to exhibit an operative impedance that varies according to the configuration data, in which the configuration data can take such values that the operative impedance is discretely variable, the configurable circuit including an impedance component, in which the fuse switch controls whether the impedance component will be part of the operative impedance; and a non-volatile memory (NVM) memory array distinct from the fuse and having a plurality of NVM cells that are addressable in terms of a row and a column and are adapted to store data in a way that survives loss of power.

2. The circuit of claim 1, wherein the fuse is part of the operational component.

3. The circuit of claim 1, further comprising:

another operational component, and wherein the fuse is part of the other operational component.

4. The circuit of claim 1, wherein the configuration data is first input in the NVM memory array from the fuse, and then it is input in the operational component from the NVM memory array.

5. The circuit of claim 1, wherein the operational component inputs the configuration data responsive to a command signal.

6. The circuit of claim 5, wherein the command signal is a reset signal.

7. The circuit of claim 5, wherein the command signal is a power-on reset signal.

8. The circuit of claim 5, wherein the command signal is received during testing.

9. The circuit of claim 8, wherein the command signal is received while the circuit is formed in a wafer segment comprising a plurality of additional RFID tag circuits.

10. The circuit of claim 1, wherein the operational component is a random number generator.

11. The circuit of claim 1, wherein the operational component is a power-on reset circuit.

12. The circuit of claim 1, wherein the operational component is one of a demodulator, a modulator, an antenna port tuner, a rectifier, a power management unit, an oscillator, and a state machine.

13. The circuit of claim 1, further comprising:

a controller adapted to sense a performance of the operational component, determine the configuration data so as to adjust the performance, and to program the configuration data in the fuse.

14. The circuit of claim 1, wherein a value for the configuration data is encoded in an amount of charge stored in a device.

15. The circuit of claim 1, wherein the NVM element includes a first floating gate of a first floating-gate transistor, and the configuration data is encoded in terms of a variable amount of charge stored on the first floating gate.

16. The circuit of claim 1, wherein
the fuse includes a binary output circuit adapted to output a binary value dependent on the configuration data, and
the tag operational component receives an output of the binary output circuit.

17. The circuit of claim 16, wherein the binary output circuit includes
a master latch, and
a slave latch having a slave-latch input coupled to an output of the master latch.

18. The circuit of claim 17, wherein
the slave latch further has a slave-latch node configured to receive a slave-latch signal.

19. An RFID tag circuit comprising:
a fuse adapted to store configuration data in a way that survives loss of power, the fuse including a nonvolatile memory (NVM) element for storing the configuration data, the NVM element including a floating gate of a floating-gate transistor which is adapted to be in triode operation;
an operational component adapted to operate based on the configuration data, the operational component including a configurable circuit adapted to exhibit an operative impedance that varies continuously according to the configuration data, wherein the configuration data is first input in the NVM memory array from the fuse, and then it is input in the operational component from the NVM memory array; and
a non-volatile memory (NVM) memory array distinct from the fuse and having a plurality of NVM cells that are addressable in terms of a row and a column and are adapted to store data in a way that survives loss of power.

20. The circuit of claim 19, wherein
the fuse is part of the operational component.

21. The circuit of claim 19, further comprising:
another operational component, and
wherein the fuse is part of the other operational component.

22. The circuit of claim 19, wherein
the operational component inputs the configuration data responsive to a command signal.

23. The circuit of claim 22, wherein
the command signal is a reset signal.

24. The circuit of claim 22, wherein
the command signal is a power-on reset signal.

25. The circuit of claim 22, wherein
the command signal is received during testing.

26. The circuit of claim 25, wherein
the command signal is received while the circuit is formed in a wafer segment comprising a plurality of additional RFID tag circuits.

27. The circuit of claim 19, wherein
the operational component is a random number generator.

28. The circuit of claim 19, wherein
the operational component is a power-on reset circuit.

29. The circuit of claim 19, wherein
the operational component is one of a demodulator, a modulator, an antenna port tuner, a rectifier, a power management unit, an oscillator, and a state machine.

30. An RFID tag circuit comprising:
a fuse adapted to store configuration data in a way that survives loss of power, a value for the configuration data being encoded in an amount of charge stored in a first floating gate;
an operational component adapted to operate based on the configuration data, wherein the configuration data is first input in the NVM memory array from the fuse, and then it is input in the operational component from the NVM memory array; and
a non-volatile memory (NVM) memory array distinct from the fuse and having a plurality of NVM cells that are addressable in terms of a row and a column and are adapted to store data in a way that survives loss of power.

31. The circuit of claim 30, wherein
the fuse is one-time programmable.

32. The circuit of claim 30, wherein
the fuse is multiple-times programmable.

33. The circuit of claim 30, wherein
the fuse is part of the operational component.

34. The circuit of claim 30, further comprising:
another operational component, and wherein the fuse is part of the other operational component.

35. The circuit of claim 30, wherein
the operational component inputs the configuration data responsive to a command signal.

36. The circuit of claim 35, wherein
the command signal is a reset signal.

37. The circuit of claim 35, wherein
the command signal is a power-on reset signal.

38. The circuit of claim 35, wherein
the command signal is received during testing.

39. The circuit of claim 38, wherein
the command signal is received while the circuit is formed in a wafer segment comprising a plurality of additional RFID tag circuits.

40. The circuit of claim 30, wherein
the operational component is a random number generator.

41. The circuit of claim 30, wherein
the operational component is a power-on reset circuit.

42. The circuit of claim 30, wherein
the operational component is one of a demodulator, a modulator, an antenna port tuner, a rectifier, a power management unit, an oscillator, and a state machine.

43. The circuit of claim 30, further comprising:
a controller adapted to program the configuration data in the fuse.

44. The circuit of claim 43, wherein
the controller is adapted to determine the configuration data to program in the fuse.

45. The circuit of claim 44, wherein
the controller is adapted to sense a performance of the operational component, and
wherein determining is performed so as to adjust the performance.

46. The circuit of claim 30, wherein
the fuse includes a first floating-gate transistor that includes the first floating gate, and a second transistor that operates in a differential mode with the first transistor.

47. The circuit of claim 46, wherein
the first transistor is a transistor selected from the group consisting of: nFET, pFET, FinFET, and multi-gate FET.

48. The circuit of claim 30, wherein
the amount of charge may be changed using one of Fowler-Nordheim tunneling, bidirectional Fowler-Nordheim tunneling, hot-electron injection, direct tunneling and hot-hole injection.

49. The circuit of claim 30, wherein
the fuse includes a binary output circuit adapted to output a binary value dependent on the configuration data, and the tag operational component receives an output of the binary output circuit.

50. The circuit of claim 49, wherein the binary output circuit is a latch.

51. The circuit of claim 50, wherein the latch has two cross-coupled inverters.

52. The circuit of claim 49, wherein the binary output circuit includes a master latch, and a slave latch having a slave-latch input coupled to an output of the master latch.

53. The circuit of claim 52, wherein the slave latch further has a slave-latch node configured to receive a slave-latch signal.

54. The circuit of claim 49, wherein the fuse further includes a second nonvolatile memory element coupled to the binary output circuit.

55. The circuit of claim 49, wherein the fuse further includes a capacitive element coupled to an output of the binary output circuit.

56. An RFID tag circuit comprising:

a fuse adapted to store configuration data in a way that survives loss of power, a value for the configuration data being encoded in an amount of charge stored in a first floating gate;

an operational component adapted to operate based on the configuration data; and a non-volatile memory (NVM) memory array distinct from the fuse and having a plurality of NVM cells that are addressable in terms of a row and a column and are adapted to store data in a way that survives loss of power, wherein the configuration data is first input in the NVM memory array from the fuse, and then it is input in the operational component from the NVM memory array, the fuse includes a binary output circuit adapted to output a binary value dependent on the configuration data, and the tag operational component receives an output of the binary output circuit.

57. The circuit of claim 56, wherein the binary output circuit is a latch.

58. The circuit of claim 57, wherein the latch has two cross-coupled inverters.

59. The circuit of claim 56, wherein the binary output circuit includes a master latch, and a slave latch having a slave-latch input coupled to an output of the master latch.

60. The circuit of claim 59, wherein the slave latch further has a slave-latch node configured to receive a slave-latch signal.

61. The circuit of claim 56, wherein the fuse further includes a second nonvolatile memory element coupled to the binary output circuit.

62. The circuit of claim 56, wherein the fuse further includes a capacitive element coupled to an output of the binary output circuit.

* * * * *

UNITED STATES PATENT AND TRADEMARK OFFICE

CERTIFICATE OF CORRECTION

PATENT NO. : 7,307,529 B2
APPLICATION NO. : 11/016546
DATED : December 11, 2007
INVENTOR(S) : Gutnik et al.

It is certified that error appears in the above-identified patent and that said Letters Patent is hereby corrected as shown below:

Column 1, line 19, after “10/813,907” insert -- [Attorney Docket No. IMPJ-0027A]. --.

Column 1, line 23, after “10/814,866” insert -- [Attorney Docket No. IMPJ-0027B]. --.

Column 1, line 27, after “10/814,868” insert -- [Attorney Docket No. IMPJ-0027C]. --.

Column 5, line 16, delete “Cells” and insert -- cells --, therefor.

Column 12, line 11, delete “12780N” and insert -- 1278 ON --, therefor.

Signed and Sealed this

Twenty-ninth Day of April, 2008

JON W. DUDAS
*Director of the United States Patent and Trademark Office*